United States Patent
Kagami et al.

(10) Patent No.: US 6,839,205 B2
(45) Date of Patent: Jan. 4, 2005

(54) MAGNETO-RESISTIVE DEVICE, AND MAGNETIC HEAD AND HEAD SUSPENSION ASSEMBLY USING SAME

(75) Inventors: Takeo Kagami, Tokyo (JP); Norio Takahashi, Tokyo (JP); Takumi Uesugi, Tokyo (JP)

(73) Assignee: TDK Corporation, Tokyo (JP)

( * ) Notice: Subject to any disclaimer, the term of this patent is extended or adjusted under 35 U.S.C. 154(b) by 247 days.

(21) Appl. No.: 10/211,366

(22) Filed: Aug. 5, 2002

(65) Prior Publication Data

US 2003/0039080 A1 Feb. 27, 2003

(30) Foreign Application Priority Data

Aug. 14, 2001 (JP) ........................................ 2001-245885

(51) Int. Cl.[7] .............................................. G11B 5/127
(52) U.S. Cl. .................................................. 360/324.1
(58) Field of Search ....................... 360/324.12, 324.2, 360/324.1, 324.3, 324.11, 327.1, 327.2, 327.23, 126, 119, 125

(56) References Cited

U.S. PATENT DOCUMENTS

| 5,668,688 A | | 9/1997 | Dykes et al. | |
| 5,959,810 A | * | 9/1999 | Kakihara et al. | 360/324.12 |
| 6,128,167 A | * | 10/2000 | Saito et al. | 360/324.12 |
| 6,542,342 B1 | * | 4/2003 | Hayashi et al. | 360/324.2 |
| 6,718,621 B1 | * | 4/2004 | Hayashi et al. | 29/603.08 |
| 2003/0035256 A1 | * | 2/2003 | Hayashi et al. | 360/324.12 |

OTHER PUBLICATIONS

Nagasaka et al., "Giant Magnetoresistance Properties of Spin Valve Films in Current–perpendicular–to–plane Geometry", Journal of Magnetics Society of Japan, vol. 25, No. 4–2, pp. 807–810, 2001.

* cited by examiner

*Primary Examiner*—Allen Cao
(74) *Attorney, Agent, or Firm*—Oliff & Berridge, PLC

(57) ABSTRACT

A magneto-resistive device has a magneto-resistive layer laminated between electrodes. The magneto-resistive layer has a non-magnetic layer, a pinned layer and a free layer sandwiching the non-magnetic layer, and a pin layer formed on the pinned layer on the opposite side to the free layer. The pin layer is formed in a region which substantially overlaps with an effective region in a film plane direction in which a current flows in a direction substantially perpendicular to the film plane between the electrodes in a predetermined thickness, and is formed in a region which does not substantially overlap with the effective region substantially in the same thickness as the predetermined thickness or in a thickness smaller than the predetermined thickness, continuous from the region which substantially overlaps with the effective region.

20 Claims, 11 Drawing Sheets

MAGNETO-RESISTIVE DEVICE, AND MAGNETIC HEAD AND HEAD SUSPENSION ASSEMBLY USING SAME

BACKGROUND OF THE INVENTION

The present invention relates to a magneto-resistive device, and a magnetic head and a head suspension assembly using the same.

With the trend to a larger capacity and a smaller size of hard disk drives (HDD), heads are required to have a higher sensitivity and larger output. To meet this requirement, strenuous efforts have been made to improve characteristics of GMR head (Giant Magneto-Resistive Head) currently available on the market. On the other hand, intense development is under way for a tunnel magneto-resistive head (TMR head) which can be expected to have a resistance changing ratio twice or more higher than the GMR head.

Generally, the GMR head differs from the TMR head in the head structure due to a difference in a direction in which a sense current is fed. A head structure adapted to feed a sense current in parallel with a film plane, as in a general GMR head, is referred to as a CIP (Current In Plane) structure, while a head structure adapted to feed a sense current perpendicularly to a film plane, as in the TMR head, is referred to as a CPP (Current Perpendicular to Plane) structure. Since the CPP structure can use a magnetic shield itself as an electrode, it is essentially free from short-circuiting between the magnetic shield and a device (defective insulation) which is a serious problem in reducing a lead gap in the CIP structure. For this reason, the CPP structure is significantly advantageous in providing a higher recording density.

The TMR head, which anticipates the CPP head, has drawn attention because of its high MR ratio, but is confronted by a grave problem of a reduction in resistance.

On the other hand, a CPP-GMR head which employs a spin valve (SV) film, used in the CIP structure, for a magneto-resistive device, though in the CPP structure, can be reduced in resistance because of the employment of the spin valve film which does not include an insulating film in the magneto-resistive device. An article entitled "Giant Magnetoresistance Properties of Spin Valve Films in Current-perpendicular-to-plane Geometry" by Nagasaka et al. (Journal of Magnetics Society of Japan, Vol. 25, No. 4–2, pp. 807–810, 2001) discloses a magneto-resistive device which has a CPP structure using a spin valve film.

In such a conventional magneto-resistive device which has the CPP structure using a spin valve film, a cap layer, a pin layer, a pinned layer, a non-magnetic layer, and a free layer formed between an upper electrode and a lower electrode, which make up the spin valve film, are formed substantially only in regions in which they overlap with one another, and the respective layers have substantially the same dimensions in a plane direction which is largely smaller than the area of the upper electrode and lower electrode.

However, the conventional magneto-resistive device having the CPP structure using the spin valve film significantly excels the TMR device in the ability to reduce the resistance, whereas an actual MR ratio of the conventional magneto-resistive device, provided as the whole device between the upper electrode and lower electrode, is prohibitively low, for example, several percent.

While the aforementioned article states that the MR ratio can be increased, the MR ratio referred to in the article is not the actual MR ratio provided as the whole device between the upper electrode and lower electrode, but the MR ratio only for a portion which exhibits a magneto-resistive change (i.e., a laminate made up of the pinned layer, non-magnetic layer and free layer). Specifically, while the pin layer, cap layer and the like exist between the upper electrode and lower electrode, the aforementioned article refers to the MR ratio without taking into account the influence of these fixed resistive components. This is why the MR ratio referred to in the article is apparently higher.

SUMMARY OF THE INVENTION

It is an object of the present invention to provide a magneto-resistive device which is capable of increasing the actual MR ratio as compared with the prior art though it is a magneto-resistive device which has a CPP structure using a spin valve film.

It is another object of the present invention to provide a magnetic head which is capable of generating a high output signal even in a narrow track to increase a recording density by using the magneto-resistive device as mentioned above.

It is a further object of the present invention to provide a head suspension assembly which is capable of increasing a recording density for a magnetic disk drive and the like.

A magneto-resistive device according to a first aspect of the present invention comprises a first electrode formed on one surface side of a base; a magneto-resistive layer formed on one surface side of the first electrode, the one surface being opposite to other surface of the first electrode facing to the base; and a second electrode formed on one surface side of the magneto-resistive layer, the one surface being opposite to other surface of the magneto-resistive layer facing to the first electrode. The magneto-resistive layer includes a non-magnetic layer; a free layer formed on one surface side of the non-magnetic layer; a pinned layer formed on other surface side of the non-magnetic layer; and a pin layer formed on one surface side of the pinned layer, the one surface being opposite to other surface of the pinned layer facing to the non-magnetic layer. The pin layer is formed in a region which substantially overlaps with an effective region in a film plane direction in which a current flows in a direction substantially perpendicular to the film plane between the first electrode and the second electrode in a predetermined thickness, and is formed in a region which does not substantially overlap with the effective region substantially in the same thickness as the predetermined thickness or in a thickness smaller than the predetermined thickness, continuous from the region which substantially overlaps with the effective region. The first and second electrodes may additionally serve as magnetic shield layers.

In the first aspect, since the first and second electrodes are positioned with respect to the magneto-resistive layer as described above, a CPP structure is realized. Therefore, the magneto-resistive device is essentially free from short-circuiting between a magnetic shield and the device (defective insulation) which is regarded as a grave problem in reducing a read gap in the CIP structure.

Also, in the first aspect, the magneto-resistive layer includes the non-magnetic layer, free layer, pinned layer, and pin layer arranged as described above, to constitute a so-called spin valve film. It is therefore possible to reduce the resistance, as compared with a TMR device.

In the first aspect, the pin layer is not only formed in the region which substantially overlaps with the effective region in a predetermined thickness, but also formed in the region which does not substantially overlap with the effective region substantially in the same thickness as the predetermined thickness or in a thickness smaller than the predetermined thickness, continuous from the region which substantially overlaps with the effective region. Since the region in which the pin layer is formed spreads from the effective region as described above, a path through which a sense current flows is increased in proportion to the spreading pin layer, resulting in a lower resistance value of the pin layer for the sense current flowing between the first and second electrodes. The pin layer generally made of an antiferromagnetic material has a relatively large resistivity (for example, 100 $\mu\Omega$cm or more), so that the resistance value of the pin layer is reduced more by the spreading pin layer. In this manner, according to the first aspect, the resistance value of the pin layer is reduced for the sense current, resulting in a reduction in a fixed resistance value of the entire device between the first and second electrodes. Therefore, according to the first aspect, an actual MR ratio (=$\Delta$R/R), provided by the entire device, between the first and second electrodes, has a smaller denominator R to increase the actual MR ratio.

For the actual output of the device, the product Is×$\Delta$R of $\Delta$R and the sense current Is is critical. Therefore, the output of the device cannot be improved only by reducing the denominator R of the actual MR ratio (=$\Delta$R/R) to improve the MR ratio. However, when the structure in the first aspect is employed to reduce R and the area of the effective region, $\Delta$R can be increased with the improved MR ratio maintained, because R and $\Delta$R are substantially reciprocally proportional to the area of the effective region. In this manner, according to the first aspect, the MR ratio and output of the device can be improved only by reducing, for example, the area of the effective region, so that the structure according to the first aspect is highly valuable in practical use.

As described above, a reduction in the area of the effective region is one factor for effectively associating the effect of the first aspect with an improved output of the device. As another exemplary factor, the inventors devised a structure according to a third aspect, later described. This factor will be described later in connection with the third aspect.

In the magneto-resistive device according to a second aspect of the present invention, the pin layer has one surface substantially entirely placed in electrical contact with one surface of the first electrode or the second electrode in the first aspect. In the second aspect, the one surface of the pin layer may be substantially entirely in direct contact with the one surface of the first electrode or the second electrode or through a conductive film.

According to the second aspect, since the one surface of the pin layer is substantially entirely in electrical contact with the surface of the electrode, the resistance value of the pin layer is further reduced for the sense current, resulting in a yet higher actual MR ratio.

The magneto-resistive device according to a third aspect of the present invention further comprises, in the first or second aspect, a thin insulating layer formed between at least one surface of at least one layer intervening between the first electrode and the second electrode and an facing surface of an adjacent layer facing to the at least one surface over at least a region which substantially overlaps with at least the effective region to such an extent that the one layer is not completely electrically insulated from the adjacent layer.

A thin layer such as the thin insulating layer can be modeled as a layer substantially uniformly formed with pin holes or the like for purposes of description. Thus, the thin insulating layer effectively reduces the area of a path through which a current flows between the overlying and underlying layers, thereby producing a similar effect to that produced by reducing the area of the effective region, without actually reducing the area of the effective area. In other words, the thin insulating layer acts to increase the aforementioned $\Delta$R while maintaining an improved MR ratio. Thus, according to the third aspect, the effect produced by the first aspect can be effectively associated with an improved output of the device. As such, according to the third aspect is preferable because the output of the device is increased. The resulting effect is similar to a reduction in the area of the effective region. However, since the reduction in the area of the effective region is limited for reasons of manufacturing, the structure in the third aspect can be employed irrespective of such a limitation due to the manufacturing, thus providing a significant advantage.

In the magneto-resistive device according to a fourth aspect of the present invention, the at least one layer includes any constituent layer of one of the non-magnetic layer, the free layer, and the pinned layer in the third aspect.

As the thin insulating layer is disposed at a position referred to by the fourth aspect, the thin insulating layer is preferred because it more effectively performs a function of adjusting a path for the sense current.

In the magneto-resistive device according to a fifth aspect of the present invention, the thin insulating layer includes an oxide or a nitride in the third or fourth aspect. The use of such a material for the thin insulating layer is preferable because it is effective as an insulating material and is unlikely to damage the characteristics of other films.

In the magneto-resistive device according to a sixth aspect of the present invention, the non-magnetic layer is formed only in the region which substantially overlaps with the effective region in any of the first to fifth aspects.

In the magneto-resistive device according to a seventh aspect of the present invention, the free layer is formed only in the region which substantially overlaps with the effective region in any of the first to sixth aspects.

In the magneto-resistive device according to an eighth aspect of the present invention, the pinned layer is formed only in the region which substantially overlaps with the effective region in any of the first to seventh aspects.

While the sixth to eighth aspects illustrate layers which can define the effective region, elements which define the effective region are not limited to them.

In the magneto-resistive device according to a ninth aspect of the present invention, the pin layer includes one or more of materials selected from a group consisting of PtMn, IrMn, RuRhMn, FeMn, NiMn, PdPtMn, RhMn, CrMnPt, and other Mn-based alloys in any of the first to eighth aspects.

The materials enumerated in the ninth aspect excel in the characteristic of pinning the pinned layer, but have relatively high resistivities. Therefore, according to the ninth aspect, the pin layer thus spread results in a higher effect of reducing the resistance value of the pin layer for a sense current, thereby producing a significant effect of increasing the actual MR ratio provided by the entire device between the first and second electrodes.

A magneto-resistive device according to a tenth aspect of the present invention comprises a first electrode formed on one surface side of a base; a magneto-resistive layer formed on one surface side of the first electrode, the one surface being opposite to other surface of the first electrode facing to the base; and a second electrode formed on one surface side of the magneto-resistive layer, the one surface being opposite to other surface of the magneto-resistive layer facing to the first electrode. The magneto-resistive layer includes a free layer; a first non-magnetic layer formed on one surface side of the free layer, the one surface being closer to the first electrode than other surface of the free layer opposite to the one surface of the free layer; a first pinned layer formed on one surface side of the first non-magnetic layer, the one surface being closer to the first electrode than other surface of the first non-magnetic layer opposite to the one surface of the first non-magnetic layer; a first pin layer formed on one surface side of the first pinned layer, the one surface being closer to the first electrode than other surface of the first pinned layer opposite to the one surface of the first pinned layer; a second non-magnetic layer formed on one surface side of the free layer, the one surface being closer to the second electrode than other surface of the free layer opposite to the one surface of the free layer; a second pinned layer formed on one surface side of the second non-magnetic layer, the one surface being closer to the second electrode than other surface of the second non-magnetic layer opposite to the one surface of the second non-magnetic layer; and a second pin layer formed on one surface side of the second pinned layer, the one surface being closer to the second electrode than other surface of the second pinned layer opposite to the one surface of the second pinned layer. At least one of the first pin layer and the second pin layer is formed in a region which substantially overlaps with an effective region in a film plane direction in which a current flows in a direction substantially perpendicular to the film plane between the first electrode and the second electrode in a predetermined thickness, and is formed in a region which does not substantially overlap with the effective region substantially in the same thickness as the predetermined thickness or in a thickness smaller than the predetermined thickness, continuous from the region which substantially overlaps with the effective region. The first and second electrodes may additionally serve as magnetic shield layers.

In the tenth aspect, since the first and second electrodes are positioned with respect to the magneto-resistive layer as described above, a CPP structure is realized. Therefore, the magneto-resistive device is essentially free from short-circuiting between a magnetic shield and the device (defective insulation) which is regarded as a grave problem in reducing a read gap in the CIP structure.

Also, in the tenth aspect, the magneto-resistive layer includes the free layer, first and second non-magnetic layers, first and second pinned layers, and first and second pin layers, as described above, to constitute a dual-type spin valve film. It is therefore possible to reduce the resistance, as compared with a TMR device.

In the tenth aspect, at least one pin layer is not only formed in the region which substantially overlaps with the effective region in a predetermined thickness, but also formed in the region which does not substantially overlap with the effective region substantially in the same thickness as the predetermined thickness or in a thickness smaller than the predetermined thickness, continuous from the region which substantially overlap with the effective region. Since the region in which at least one pin layer is formed spreads from the effective region, a path through which a sense current flows is increased in proportion to the spreading pin layer, resulting in a lower resistance value of the at least one pin layer for the sense current flowing between the first and second electrodes. In this manner, according to the tenth aspect, the resistance value of the at least one pin layer is reduced for the sense current, resulting in a reduction in a fixed resistance value of the entire device between the first and second electrodes. Therefore, according to the tenth aspect, an actual MR ratio (=ΔR/R), provided by the entire device, between the first and second electrodes, has a smaller denominator R, resulting in an increase in the actual MR ratio. Also, in the tenth aspect, since the magneto-resistive device uses a dual-type spin valve film, the actual MR ratio is increased as compared with that using a single-type spin valve film.

A reduction in the area of the effective region is one factor for effectively associating the effect of the first aspect with an improved output of the device. As another exemplary factor, the inventors devised a structure according to a twelfth aspect, later described. This is similar to the first aspect.

In the magneto-resistive device according to an eleventh aspect of the present invention, the at least one pin layer has one surface substantially entirely placed in electrical contact with one surface of the first electrode or the second electrode in the tenth aspect. In the eleventh aspect, the one surface of the at least one pin layer may be substantially entirely in direct contact with the one surface of the first electrode or the second electrode or through a conductive film.

According to the eleventh aspect, since the one surface of the at least one pin layer is substantially entirely in electrical contact with the surface of the electrode, the resistance value of the at least one pin layer is further reduced for a sense current, resulting in a yet higher actual MR ratio.

The magneto-resistive device according to a twelfth aspect of the present invention further comprises, in the tenth or eleventh aspect, a thin insulating layer formed between at least one surface of at least one layer intervening between the first electrode and the second electrode and an facing surface of an adjacent layer facing to the at least one surface over at least the region which substantially overlaps with the effective region to such an extent that the at least one layer is not completely electrically insulated from the adjacent layer.

According to the twelfth aspect, the magneto-resistive device can produce similar advantages to the third aspect.

In the magneto-resistive device according to a thirteenth aspect of the present invention, the at least one layer includes any constituent layer of one of the first and second non-magnetic layers, the free layer, and the first and second pinned layers in the twelfth aspect.

As the thin insulating layer is disposed at a positioned referred to by the thirteenth aspect, the thin insulating layer is preferred because it more effectively performs a function of adjusting a path for a sense current.

In the magneto-resistive device according to a fourteenth aspect of the present invention, the thin insulating layer includes an oxide or a nitride in the twelfth or thirteenth aspect. The use of such a material for the thin insulating layer is preferable because it is effective as an insulating material and is unlikely to damage the characteristics of other films.

In the magneto-resistive device according to a fifteenth aspect of the present invention, at least one of the first and second non-magnetic layers is formed only in the region which substantially overlaps with the effective region in any of the tenth to fourteenth aspects.

In the magneto-resistive device according to a sixteenth aspect of the present invention, the free layer is formed only in the region which substantially overlaps with the effective region in any of the tenth to fifteenth aspects.

In the magneto-resistive device according to a seventeenth aspect of the present invention, at least one of the first and second pinned layers is formed only in the region which substantially overlaps with the effective region in any of the tenth to sixteenth aspects.

While the fifteenth to seventeenth aspects illustrate layers which can define the effective region, elements which define the effective region are not limited to them.

In the magneto-resistive device according to an eighteenth aspect of the present invention, each of the first and second pin layers includes one or more of materials selected from a group consisting of PtMn, IrMn, RuRhMn, FeMn, NiMn, PdPtMn, RhMn, CrMnPt, and other Mn-based alloys in any of the tenth to seventeenth aspect.

According to this eighteenth aspect, the magneto-resistive film produces a significant effect of increasing the actual MR ratio provided by the entire device between the first and second electrodes, as is the case with the aforementioned ninth aspect.

A magnetic head according to a nineteenth aspect of the present invention has a base, and a magneto-resistive device supported by the base, wherein the magneto-resistive device is a magneto-resistive device according to any of the first to eighteenth aspects.

According to this nineteenth aspect, since the magnetic head uses the magneto-resistive device according to any of the first to eighteenth aspects, a high output signal can be provided even in a narrow track, thereby increasing the recording density.

The magneto-resistive devices according to the first to eighteenth aspects have applications not limited in a magnetic head, but may be used as a magnetic sensor in a variety of other applications.

A head suspension assembly according to a twentieth aspect of the present invention comprises a magnetic head, and a suspension for supporting the magnetic head mounted near a leading end thereof, wherein the magnetic head is the magnetic head according to the nineteenth aspect.

According to this twentieth aspect, since the head suspension assembly uses the magnetic head according to the nineteenth aspect, it is possible to increase the recording density of a magnetic disk drive and the like.

DESCRIPTION OF THE PREFERRED EMBODIMENTS

In the following, a magneto-resistive device, and a magnetic head and a head suspension assembly using the same, according to the present invention will be described with reference to the accompanying drawings.

First, a magnetic head according to a first embodiment of the present invention will be described with reference to FIGS. 1 to 4.

Figure 1:
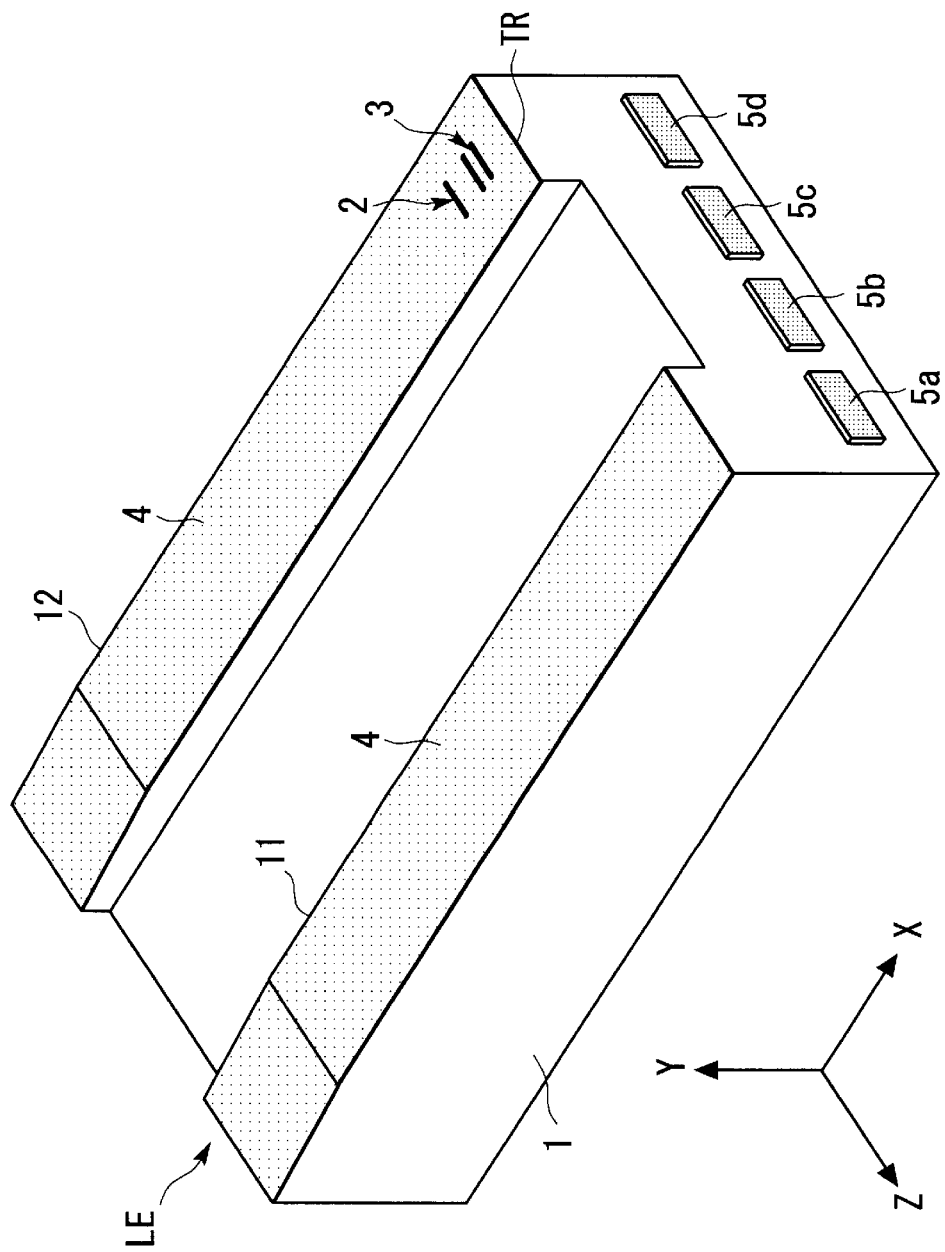
FIG. 1 is a general perspective view schematically illustrating a magnetic head according to a first embodiment of the present invention.
Figure 2:
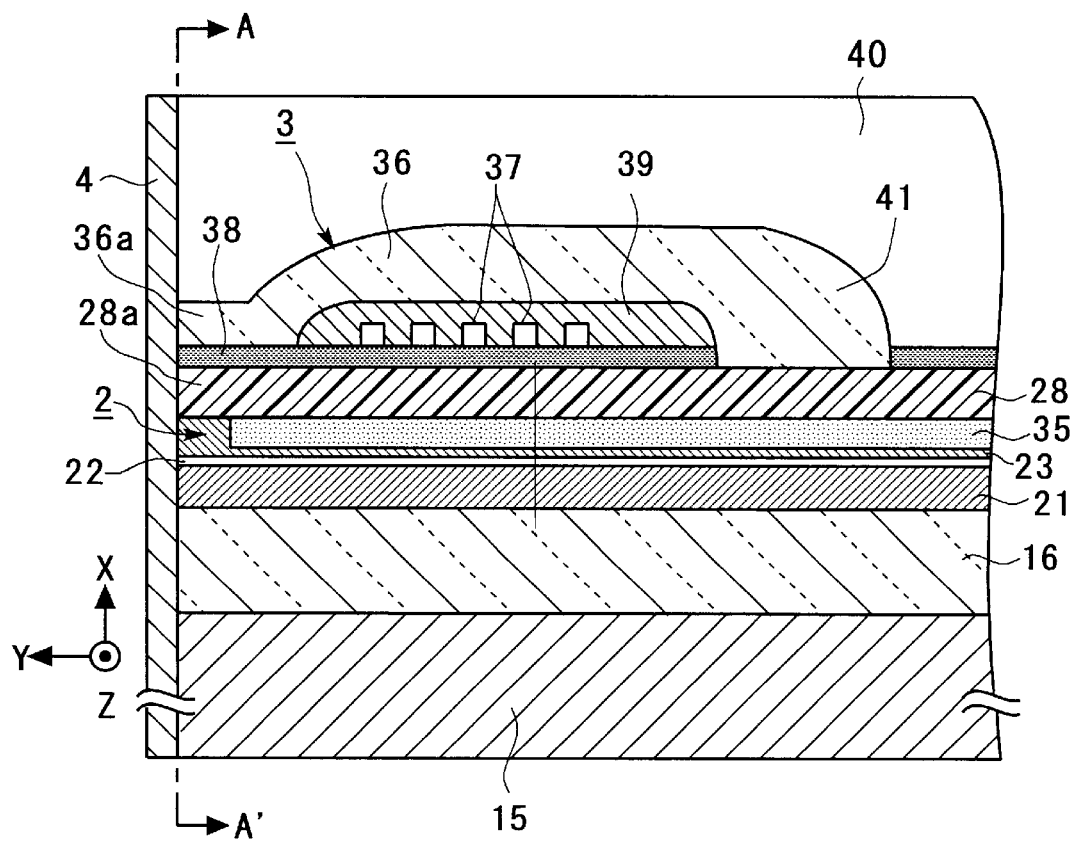
FIG. 2 is an enlarged cross-sectional view schematically illustrating a portion of a GMR device and an inductive magnetic transducing device in the magnetic head illustrated in FIG. 1.
Figure 3:
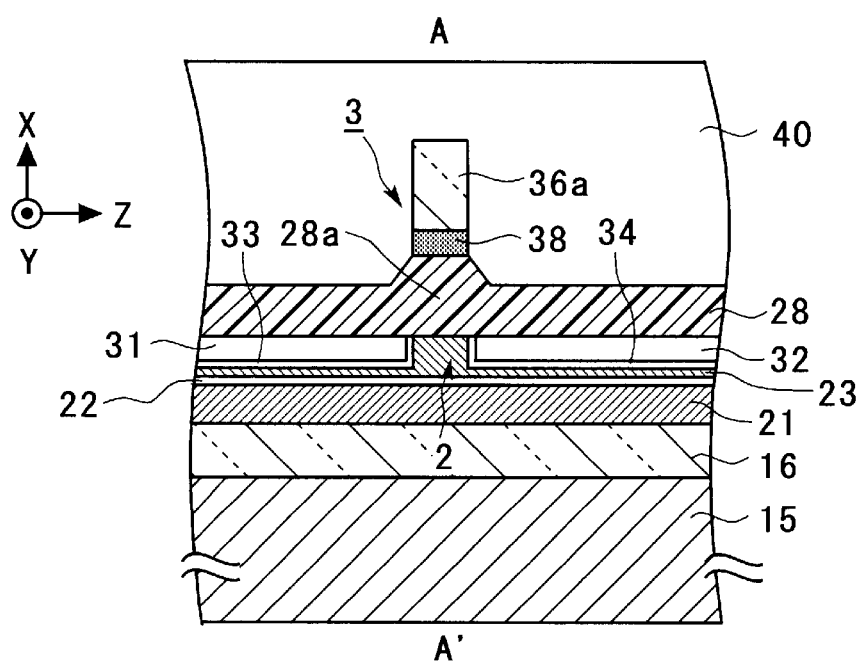
FIG. 3 is a general sectional view taken along a line A-A' indicated by arrows in FIG. 2.
Figure 4:
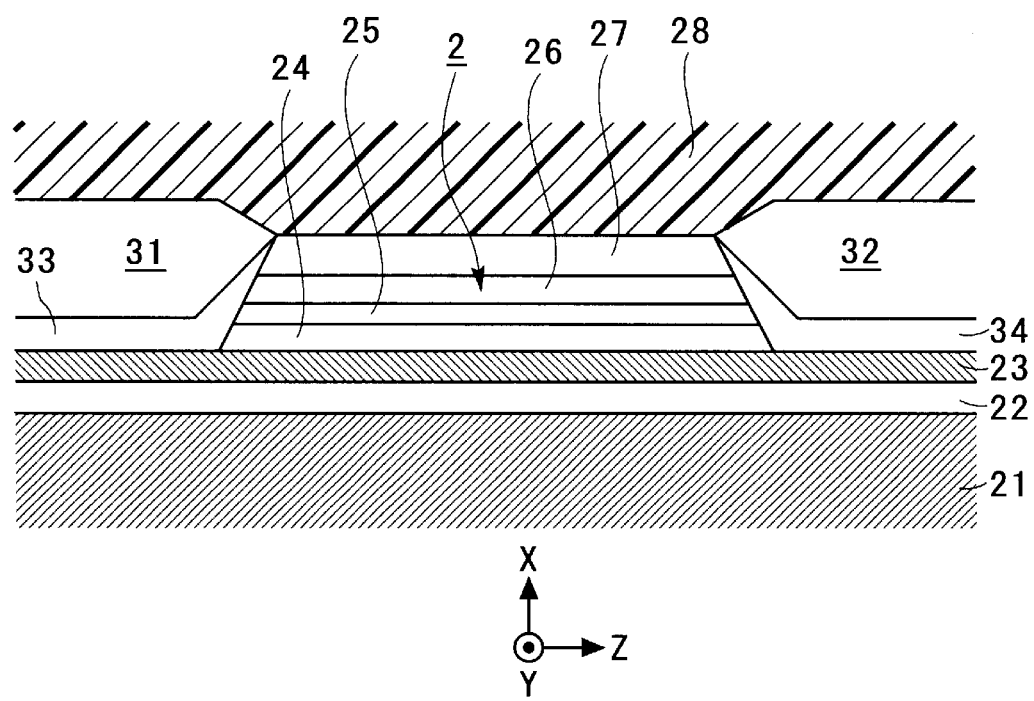
FIG. 4 is a further enlarged view illustrating around the GMR device in FIG. 3.

FIG. 1 is a general perspective view schematically illustrating the magnetic head according to the first embodiment of the present invention. FIG. 2 is an enlarged cross-sectional view schematically illustrating a portion of a GMR device 2 and an inductive magnetic transducing device 3 in the magnetic head illustrated in FIG. 1. FIG. 3 is a general sectional view taken along a line A-A' indicated by arrows in FIG. 2. FIG. 4 is a further enlarged view illustrating around the GMR device 2 in FIG. 3. For facilitating the understanding, an X-axis, a Y-axis and a Z-axis, orthogonal to one another, are defined as shown in FIGS. 1 to 4 (the same applies to figures later described). The X-axis direction is the same as a direction in which a magnetic recording medium is moved.

As illustrated in FIG. 1, the magnetic head according to the first embodiment comprises a slider 1 as a base; the GMR device 2 as a magneto-resistive device for use as a magnetic head device for reproduction; an inductive magnetic transducing device 3 as a magnetic head device for recording; and a protection film 4 made of a DLC film or the like, and is configured as a composite magnetic head. However, the magnetic head according to the present invention may comprise only the GMR device 2. Also, while the magnetic head of the first embodiment comprises one each of the devices 2, 3, the numbers of these devices are not limited in any sense.

The slider 1 has rails 11, 12 on a surface facing to a magnetic recording medium, and the surfaces of the rails 11, 12 define an air bearing surface (ABS). In the example illustrated in FIG. 1, there are two rails 11, 12, but the number of rails is not limited to two. For example, the slider 1 may have one to three rails, or the ABS may be a flat surface without rails. In addition, the ABS may be formed with a variety of geometric shapes for improving a floating characteristic and the like. The magnetic head according to the present invention may have any type of slider.

In the first embodiment, the protection film 4 is applied only on the surfaces of the rails 11, 12, so that the surface of the protection film 4 defines the ABS. However, the protection film 4 may be applied on the entire surface of the slider 1 facing to a magnetic recording medium. While the protection film 4 is preferably provided, the protection film 4 may not be necessarily provided.

The GMR device 2 and inductive magnetic transducing device 3 are disposed on the rail 12 near an air outlet end TR, as illustrated in FIG. 1. A direction in which the recording medium is moved is identical to the X-axis direction in FIG. 1, and also identical to a direction in which air flows when the magnetic recording medium is rapidly moved. Air enters from an air inlet end LE and exits from the air outlet end TR. The slider 1 is provided on an end face of the air outlet end TR with bonding pads 5a, 5b connected to the GMR device 2, and bonding pads 5c, 5d connected to the inductive magnetic transducing device 3.

As illustrated in FIGS. 2 and 3, the GMR device 2 and inductive magnetic transducing device 3 are laminated on an underlying layer 16 deposited on a ceramic base 15 which constitutes the slider 1. The ceramic base 15 is generally made of AlTic ($Al_2O_3$—Tic), SiC or the like. When $Al_2O_3$—Tic is used, an insulating film made, for example, of $Al_2O_3$ is used for the underlying layer 16 since $Al_2O_3$—Tic is electrically conductive. The underlying layer 16 may not be provided in some cases.

As illustrated in FIG. 4, the GMR device 2 comprises a lower electrode 21 formed on the underlying layer 16; an upper electrode 28 formed overlying the lower electrode 21 (opposite to the base 15); and a lower metal layer 22, a pin layer 23, a pinned layer 24, a non-magnetic layer 25, a free layer 26, and an upper metal layer (cap layer) 27 laminated in this order from the lower electrode 21 between the electrodes 21, 28.

In the first embodiment, the lower electrode 21 and upper electrode 28 are additionally used as a lower magnetic shield and an upper magnetic shield, respectively. The electrodes 21, 28 are formed of a magnetic material, for example, NiFe or the like. Though not shown, these electrodes 21, 28 are electrically connected to the aforementioned bonding pads 5a, 5b, respectively. It should be understood that a lower magnetic shield and an upper magnetic shield may be provided in addition to the lower electrode 21 and upper electrode 28.

The lower metal layer 22 is an electrically conductive material which is comprised, for example, of a laminate including a Ta layer and an NiFe layer laminated in this order from the base 15. The pinned layer 24 and free layer 26 are comprised of ferromagnetic layer formed of such a material as Fe, Co, Ni, FeCo, NiFe, CoZrNb, FeCoNi, or the like. The pin layer 23, which is comprised of a antiferromagnetic layer, is preferably formed, for example, of an Mn-based alloy such as PtMn, IrMn, RuRhMn, FeMn, NiMn, PdPtMn, RhMn, CrMnPt, or the like. The pinned layer 24 has its magnetization direction fixed in a predetermined direction by a exchange bias magnetic field between the pinned layer 24 and the pin layer 23. On the other hand, the free layer 26 basically freely varies its magnetization direction in response to an external magnetic field which is magnetic information. The non-magnetic layer 25 is formed, for example, of a material such as Cu, Au, Ag, or the like.

A material for the upper metal layer 27 is preferably selected from the following viewpoint: (a) a low resistance, (b) a tolerance of oxidization, (c) a low resistance even if oxidized. From this viewpoint, the upper metal layer 27 is preferably formed, for example, of a monolayer film or a multilayer film made of simple Ru, Rh, Os, W, Pd, Pt, Cu or Ag, or an alloy made up of two or more of these elements in combination. When the upper metal layer 27 is made of a low resistance material and formed in a small thickness, an actual MR ratio, as provided by the overall GMR device 2, can be improved.

In the first embodiment, as illustrated in FIG. 4, the dimensions of the pinned layer 24, non-magnetic layer 25, free layer 26 and upper metal layer 27, when measured in a plan view, are defined by a desired track width TW and MR height. Specifically, in the first embodiment, the pinned layer 24, non-magnetic layer 25, free layer 26 and upper metal layer 27 are formed only in a region which substantially overlaps with an effective region in a film plane direction in which a current flows in a direction substantially perpendicular to the film plane between the electrodes 21, 28. Stated another way, in the first embodiment, the pinned layer 24, non-magnetic layer 25, free layer 26 and upper metal layer 27 define the effective region. However, any one or more of the pinned layer 24, non-magnetic layer 25, free layer 26 and upper metal layer 27 may extend to a region other than the region substantially overlapping with the effective region. Such a structure may be exemplified by a third and a fourth embodiment, as later described.

On the other hand, in the first embodiment, the pin layer 23 is formed in a predetermined thickness in a region substantially overlapping with the effective region, and also formed substantially in the same thickness as the predetermined thickness in a region which does not substantially overlap with the effective region, continuous to the region substantially overlapping with the effective region, as illustrated in FIGS. 2 to 4. The lower surface of the pin layer 23 is entirely in electrical contact with the upper surface of the electrode 21 through the lower metal layer 22. It is also possible to electrically contact the lower surface of the pin layer 23 directly to the upper surface of the electrode 21 without intervention of the lower metal layer 22.

As illustrated in FIGS. 3 and 4, layers 31, 32, which include hard magnetic layers as bias layers (magnetic domain control layers) for applying a bias magnetic field for purposes of magnetic domain control, are formed on both sides of the free layer 26 in the Z-axis direction. Insulating layers 33, 34 made of $Al_2O_3$ or the like are formed below the layers 31, 32 and on sides of the layers 24–27. Though not shown, the layers 31, 32 have insulating layers made of $Al_2O_3$ or the like, respectively, as top layers which form part of the layers 31, 32. In this manner, the layers 31, 32 are electrically insulated from other layers. The hard magnetic layers included in the layers 31, 32 are formed, for example, of a material such as Cr/CoPt (cobalt platinum alloy), Cr/CoCrPt (cobalt chromium platinum alloy), TiW/CoPt, TiW/CoCrPt, or the like.

As illustrated in FIG. 2, an insulating layer 35 is formed as a gap layer in a region which is not formed with the layers 31, 32 including the hard magnetic layers and the layers 24–27 making up the GMR device 2, between the pin layer 23 and upper electrode 28. The insulating layer 35 is made, for example, of a material such as $Al_2O_3$, $SiO_2$, MgO, $TiO_2$, or the like.

As illustrated in FIGS. 2 and 3, the inductive magnetic transducing device 3 has the upper electrode 28 which is additionally used as a lower magnetic layer for the device 3; an upper magnetic layer 36; a coil layer 37; a write gap layer 38 made of alumina or the like; an insulating layer 39 made of an organic resin such as a novolac resin, a protection layer 40 made of alumina or the like, and the like. NiFe, FeN or the like, for example, is used as a material for the magnetic layer 36. Leading ends of the upper electrode 28, which is additionally used as the lower magnetic layer, and the upper magnetic layer 36 are formed as a lower pole 28a and an upper pole 36a which face each other through the write gap layer 38 made of alumina or the like in an infinitesimal thickness. The lower pole 28a and upper pole 36a write information on a magnetic recording medium. The upper electrode 28, which is additionally used as the lower magnetic layer, and the upper magnetic layer 36 are coupled to each other at a joint 41 at which a yoke is opposite to the lower pole 28a and upper pole 36a so as to complete a magnetic circuit. Within the insulating layer 39, a coil layer 37 is formed such that it is spirally wound around the joint 41 of the yoke. The coil layer 37 has both ends electrically connected to the bonding pads 5c, 5d. The coil layer 37 is arbitrary in the number of turns and the number of layers. Also, the inductive magnetic transducing device 3 may be arbitrary in structure.

Next, description will be made on an exemplary method of manufacturing a magnetic head according to the first embodiment.

First, a wafer process is performed. Specifically, a wafer 101 made of $Al_2O_3$—Tic, Sic or the like is provided for making a base 1. Using the thin film forming technology and the like, the aforementioned layers are formed in a large number of magnetic head forming regions in matrix on the wafer 101 to provide the aforementioned structure.

The outline of the wafer process will be described with reference to FIGS. 5A, 5B, 6A, 6B, 7A, 7B, 8A and 8B. These figures are diagrams schematically illustrating respective steps which make up the wafer process, wherein FIGS. 5A, 6A, 7A, 8A are general plan views, respectively; FIG. 5B is a general cross-sectional view taken along a line B-C in FIG. 5A; FIG. 6B is a general cross-sectional view taken along a line B-C in FIG. 6A; FIG. 7B is a general cross-sectional view taken along a line D-E in FIG. 7A; and FIG. 8B is a general cross-sectional view taken along a line D-E in FIG. 8A. In FIG. 6A, TW indicates the width of a track defined by the GMR device 2.

Figure 5A:
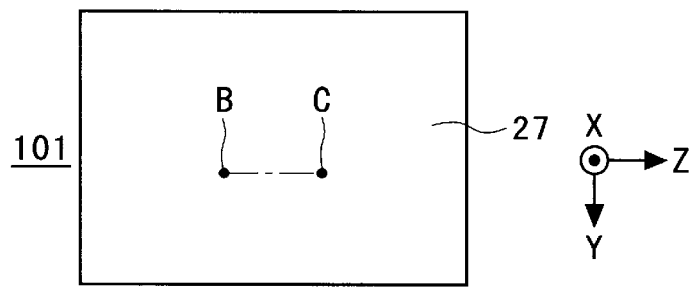
FIG. 5A is a general plan view schematically illustrating a step which makes up a wafer process in a method of manufacturing the magnetic head illustrated in FIG. 1.
Figure 5B:
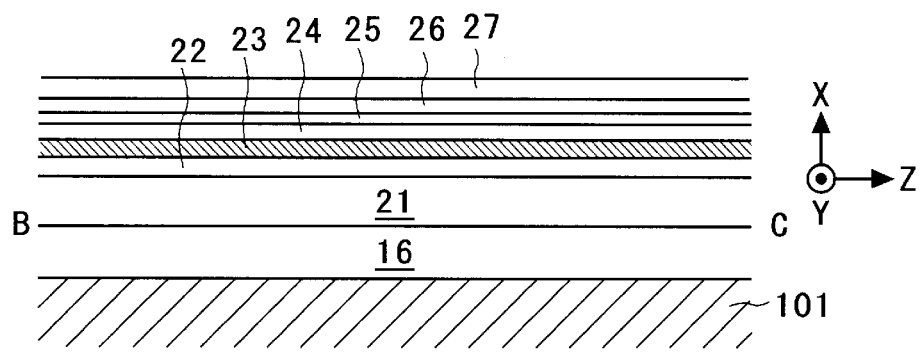
FIG. 5B is a general cross-sectional view taken along a line B-C in FIG. 5A.
Figure 6A:
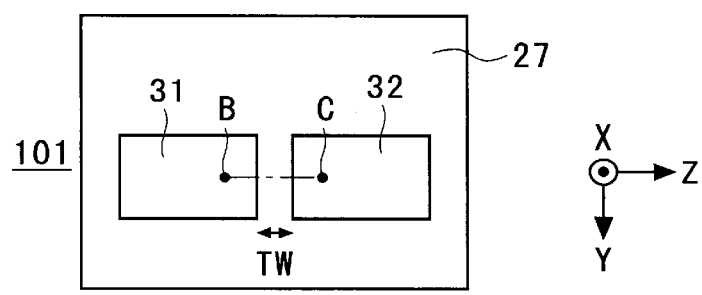
FIG. 6A is a general plan view schematically illustrating another step which makes up the wafer process in the method of manufacturing the magnetic head illustrated in FIG. 1.
Figure 6B:
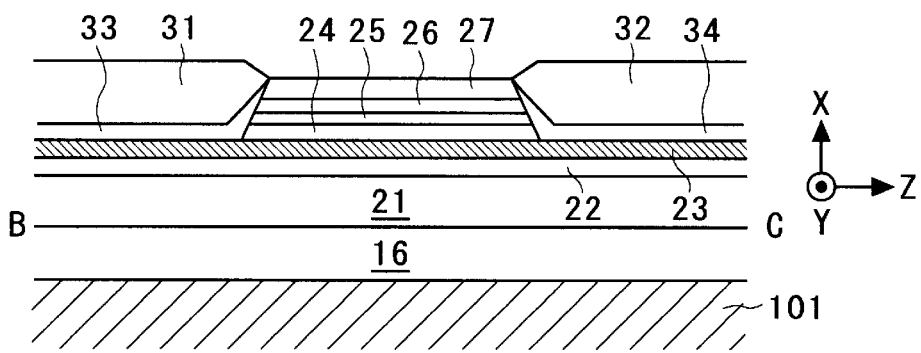
FIG. 6B is a general cross-sectional view taken along a line B-C in FIG. 6A.

First, in the wafer process, the underlying layer 16, lower electrode 21, lower metal layer 22, pin layer 23, pinned layer 24, non-magnetic layer 25, free layer 26, and upper metal layer 27 are sequentially laminated on the wafer 101 (FIGS. 5A and 5B). In this event, the lower electrode 21 is formed, for example, by a plating method, while other layers are formed, for example, by a sputtering method.

Next, the pinned layer 24, non-magnetic layer 25, free layer 26, and upper metal layer 27 are partially removed by first ion milling to define the track width TW. In this event, a position at which the first ion milling is stopped is critical. Specifically, the first ion milling should be stopped at a position at which the depth, to which the layers are removed thereby, reaches the boundary between the pinned layer 24 and pin layer 23. Ideally, the first ion milling completely removes up to the pinned layer 24 with respect to the depth direction, but is stopped at a position at which the pin layer 23 is never removed. Such a stopping position can be set appropriately by monitoring materials produced during the milling, for example, using SIMS (Secondary Ion-microprobe Mass Spectrometer). Then, after the first ion milling, the layers 31, 32 including the hard magnetic layers, and the insulating layers 33, 34 are formed using a lift-off method in portions of the layers removed by the first ion milling (FIGS. 6A and 6B).

Figure 7A:
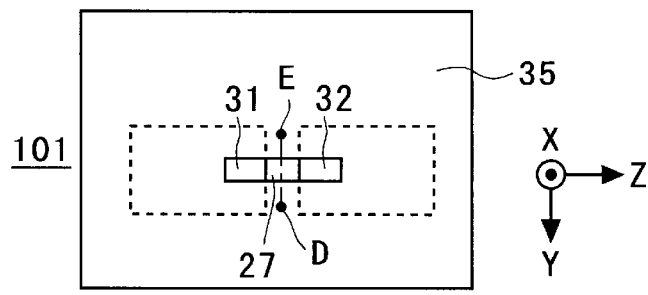
FIG. 7A is a general plan view schematically illustrating a further step which makes up the wafer process in the method of manufacturing the magnetic head illustrated in FIG. 1.
Figure 7B:
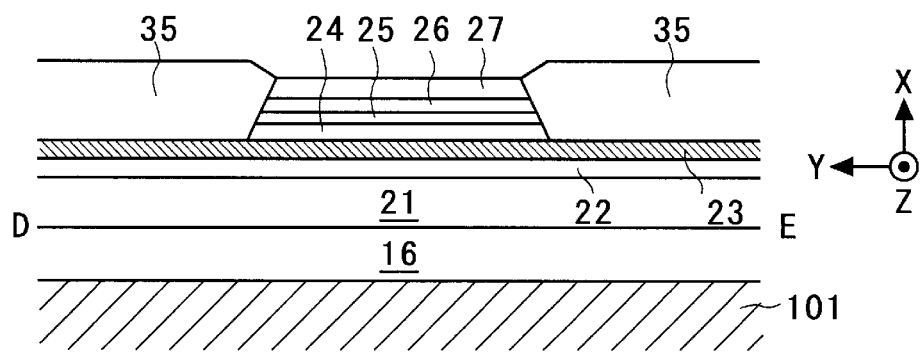
FIG. 7B is a general cross-sectional view taken along a line D-E in FIG. 7A.

Next, the pinned layer 24, non-magnetic layer 25, free layer 26, and upper metal layer 27 are patterned in conformity to a final shape by second ion milling with respect to a height direction of the GMR device 2 (FIGS. 7A and 7B). A position at which the second ion milling is stopped is also critical. Ideally, the second ion milling also completely removes the pinned layer 24 with respect to the depth direction, but is stopped at a position at which the pin layer 23 is never removed. Subsequently, the insulating layer 35 is formed and patterned by a lift-off method (FIGS. 7A and 7B).

Figure 8A:
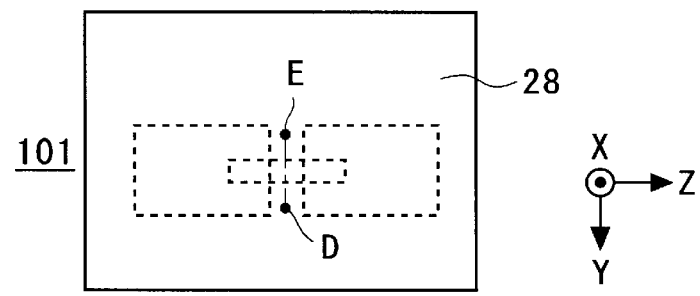
FIG. 8A is a general plan view schematically illustrating a further step which makes up the wafer process in the method of manufacturing the magnetic head illustrated in FIG. 1.
Figure 8B:
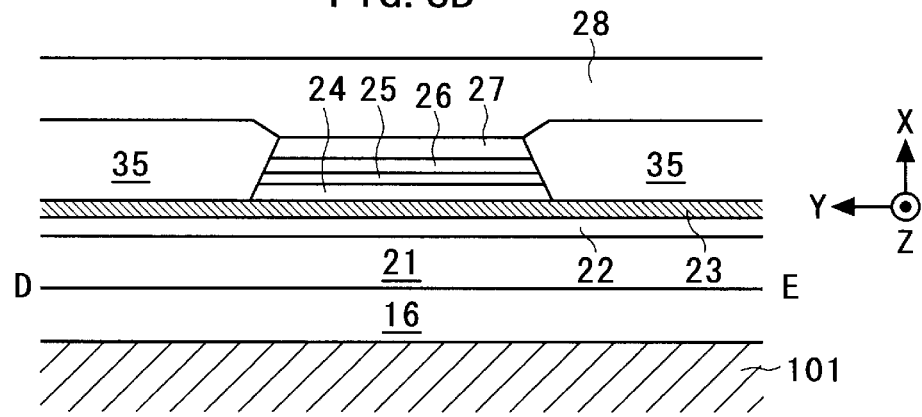
FIG. 8B is a general cross-sectional view taken along a line D-E in FIG. 8A.

Subsequently, the upper electrode 28 is formed on the wafer 101 in the state illustrated in FIGS. 7A and 7B by a plating method or the like (FIGS. 8A and 8B).

Finally, the gap layer 38, coil layer 37, insulating layer 39, upper magnetic layer 36, and protection layer 40 are formed, and the bonding pads 5a–5d and the like are further formed. Thus, the wafer process is completed.

Next, magnetic heads are completed through a known process for the wafer which has undergone the wafer process. Briefly describing, each bar (bar-shaped magnetic head aggregate) having a plurality of magnetic heads arranged in a line on the base is sawed from the wafer. Next, the bar is lapped on its ABS side for setting a throat height, an MR height, and the like. Subsequently, the ABS surface of the lapped bar is etched for removing smear as required. Next, the protection film 4 is formed on the ABS surface, additionally the rails 11, 12 are formed by etching or the like. Finally, the bar is cut by machining into individual magnetic heads. In this manner, the magnetic heads are completed in accordance with the first embodiment.

In the first embodiment, since the electrodes 21, 28 are arranged with respect to the magneto-resistive layer (pin layer 23, pinned layer 24, non-magnetic layer 25, free layer 26) in the manner described above, a CPP structure can be provided. The resulting magnetic head is therefore essentially free from the short-circuiting between the magnetic shield and device (defective insulation) which is now regarded as a grave problem in the trend of a narrower read gap in the CIP structure.

Also, in the first embodiment, the magneto-resistive layer includes the non-magnetic layer 25, free layer 26, pinned layer 24 and pin layer 23 arranged as described above, to form a so-called spin valve film. It is therefore possible to reduce the resistance as compared with a TMR device.

Further, in the first embodiment, the pin layer 23 is formed in a predetermined thickness in a region substantially overlapping with the effective region, and also formed in a region substantially not overlapping with the effective region substantially in the same thickness as the predetermined thickness, continuous from the region substantially overlapping the effective region, as illustrated in FIGS. 2 to 4. Since the region in which the pin layer 23 is formed spreads from the effective region in this manner, a sense current flows in a path increased in proportion to the spreading pin layer 23, resulting in a lower resistance value of the pin layer 23 for the sense current flowing between the electrodes 21, 28. Particularly, in the first embodiment, the pin layer 23 has the same thickness in the region not overlapping with the effective region as well as in the region overlapping with the effective region, and the pin layer 23 has the lower surface entirely in electrical contact with the upper surface of the electrode 21 through the lower metal layer 22, permitting the pin layer 23 to actually act as a portion of the electrode. It is therefore possible to reduce the resistance value of the pin layer 23 for the sense current. In this manner, the first embodiment largely reduces the resistance value of the pin layer 23 for the sense current, and consequently reduces a fixed resistance value of the entire device between the electrodes 21, 28. Thus, according to the first embodiment, the actual MR ratio (=ΔR/R), provided by the entire device between the electrodes 21, 28, has a smaller denominator R, resulting in an increase in the actual MR ratio.

For the actual output of the device, the product Is×ΔR of ΔR and sense current Is is critical. Therefore, the output of the device cannot be improved only by reducing the denominator R of the actual MR ratio (=ΔR/R) to improve the MR ratio. However, when the structure in the first embodiment is employed to reduce R and the area of the effective region, ΔR can be increased with the improved MR ratio maintained because R and ΔR are substantially reciprocally proportional to the area of the effective region. In this manner, according to the first embodiment, the MR ratio and output of the device can be improved only by reducing, for example, the area of the effective region.

It is therefore possible, according to the first embodiment, to provide a high output signal even with a narrow track and increase the recording density.

Next, a magnetic head according to a second embodiment of the present invention will be described with reference to FIG. 9.

Figure 9:
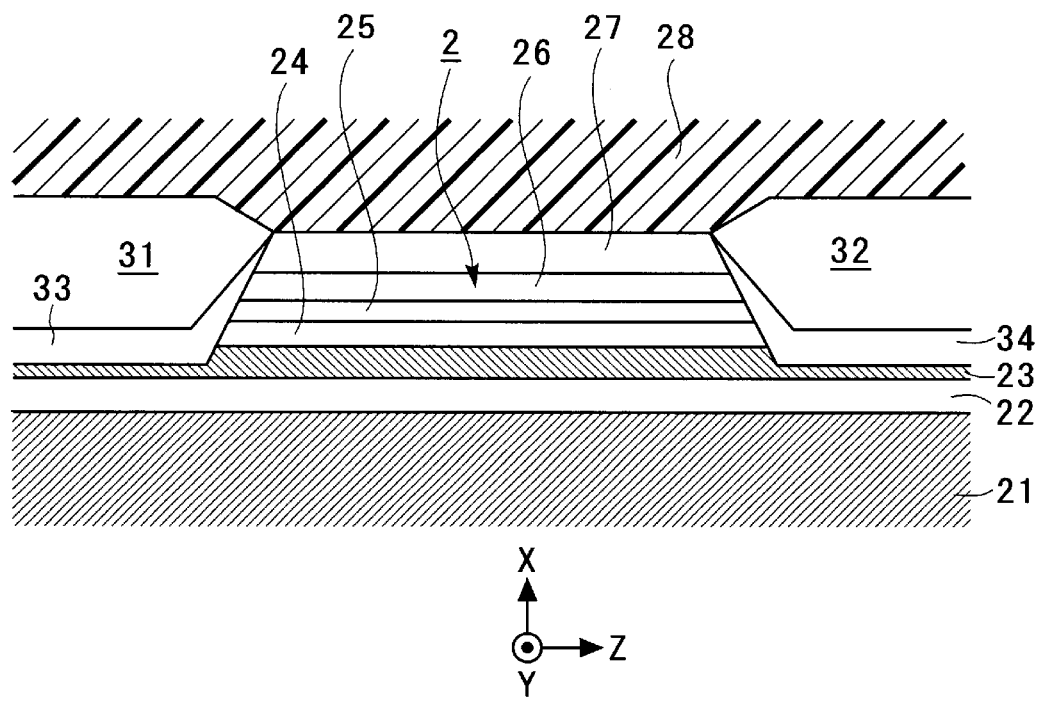
FIG. 9 is a general cross-sectional view schematically illustrating a main portion of a magnetic head according to a second embodiment of the present invention.

FIG. 9 is a general cross-sectional view schematically illustrating a main portion of the magnetic head according to the second embodiment of the present invention, and corresponds to FIG. 4. In FIG. 9, elements identical or corresponding to those in FIG. 4 are designated by the same reference numerals, and repetitive description thereon is omitted.

As can be seen from a comparison of FIG. 9 with FIG. 4, the second embodiment differs from the first embodiment only in that the thickness of the pin layer 23 in the region substantially not overlapping with the effective region is smaller than the thickness of the pin layer 23 in the region substantially overlapping with the effective region. Such a structure can be created, for example, by setting the stopping positions of the first and second ion milling with respect to the depth direction, previously described in the method of manufacturing the magnetic head according to the first embodiment, such that a portion of the pin layer 23 is removed.

According to the second embodiment, although the pin layer 23 has a slightly larger resistance value for a sense current, as compared with the first embodiment, to slightly reduce the actual MR ratio, similar advantages can be basically provided to the first embodiment.

Since a smaller thickness of the pin layer 23 in the region substantially not overlapping with the effective region results in a higher resistance value of the pin layer 23 for the sense current to reduce the actual MR ratio, the thickness of the pin layer 23 in the region substantially not overlapping with the effective region is preferably 30% or more of the thickness of the pin layer 23 in the region overlapping with the non-magnetic layer, more preferably 50% or more, and further preferably 70% ore more.

Next, a magnetic head according to a third embodiment of the present invention will be described with reference to FIG. 10.

Figure 10:
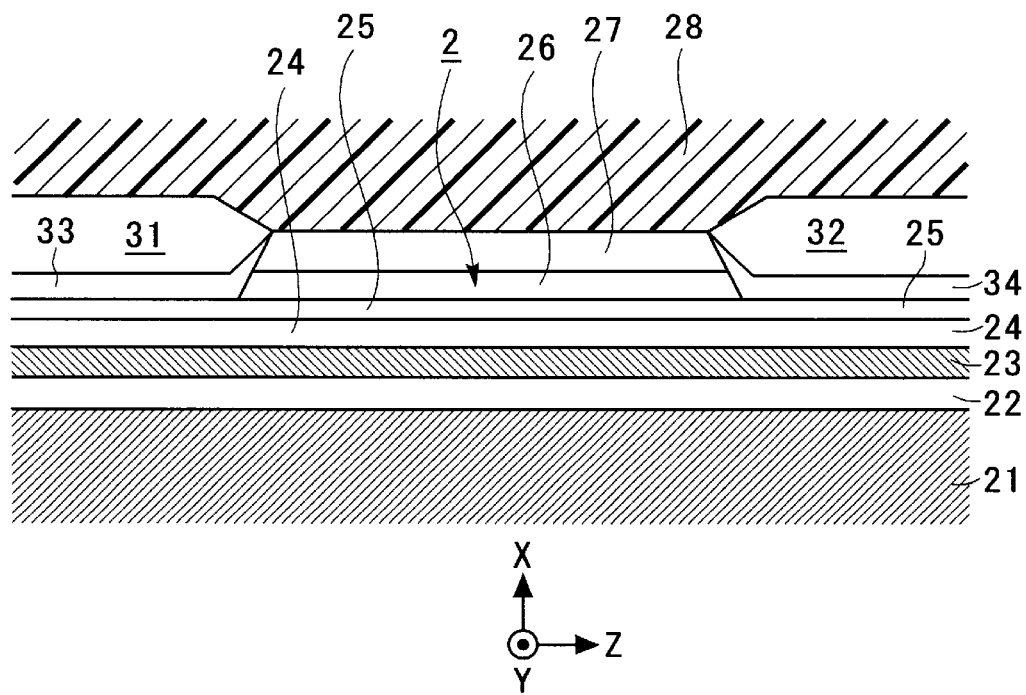
FIG. 10 is a general cross-sectional view schematically illustrating a main portion of a magnetic head according to a third embodiment of the present invention.

FIG. 10 is a general cross-sectional view schematically illustrating a main portion of the magnetic head according to the third embodiment, and corresponds to FIG. 4. In FIG. 10, elements identical or corresponding to those in FIG. 4 are designated by the same reference numerals, and repetitive description thereon is omitted.

As can be seen from a comparison of FIG. 10 with FIG. 4, the third embodiment differs from the first embodiment only in that the pinned layer 24 and non-magnetic layer 25 are also formed in the region substantially not overlapping with the effective region, substantially in the same thickness as that in the region substantially overlapping with the effective region, continuous from the region substantially overlapping with the effective region. Therefore, in the third embodiment, the free layer 26 and upper metal layer 27 define the effective region. Such a structure can be created, for example, by setting the stopping positions of the first and second ion milling with respect to the depth direction, as described above in the method of manufacturing the magnetic head according to the first embodiment, such that the stopping positions are coincident with the boundary between the non-magnetic layer 25 and free layer 26.

The third embodiment can also provide similar advantages to the first embodiment.

Next, a magnetic head according to a fourth embodiment of the present invention will be described with reference to FIG. 11.

Figure 11:
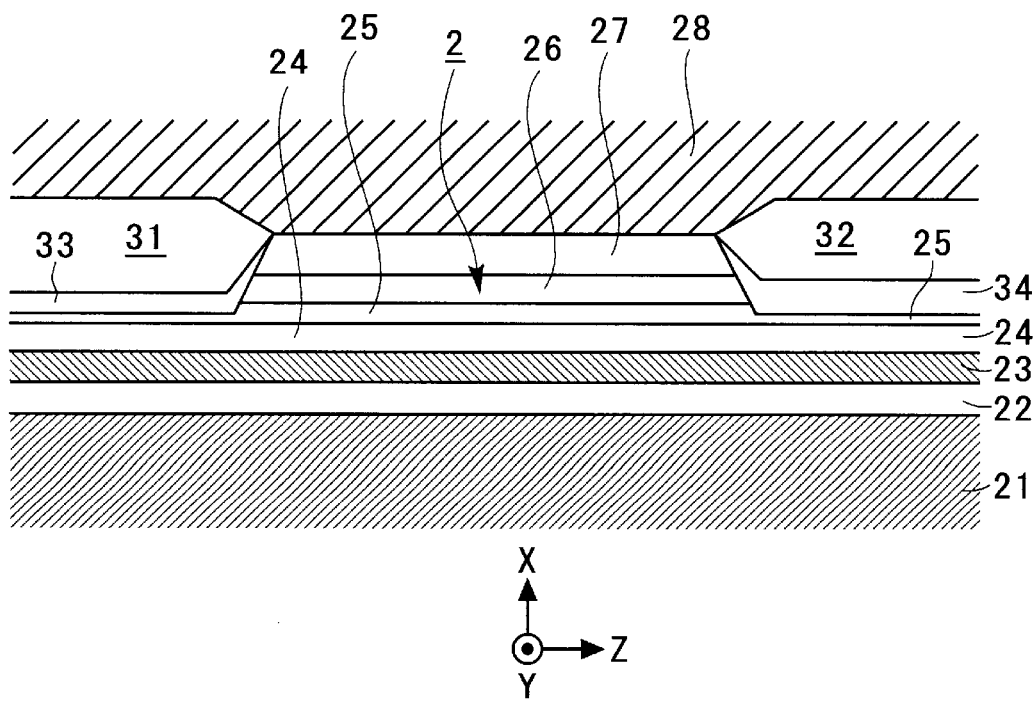
FIG. 11 is a general cross-sectional view schematically illustrating a main portion of a magnetic head according to a fourth embodiment of the present invention.

FIG. 11 is a general cross-sectional view schematically illustrating a main portion of the magnetic head according to the fourth embodiment, and corresponds to FIG. 4. In FIG. 11, elements identical or corresponding to those in FIG. 4 are designated by the same reference numerals, and repetitive description thereon is omitted.

As can be seen from a comparison of FIG. 11 with FIG. 4, the fourth embodiment differs from the first embodiment only in that (a) the pinned layer 24 is formed also in the region substantially not overlapping with the effective region substantially in the same thickness as that in the region substantially overlapping with the effective region, continuous from the region substantially overlapping with the effective region; and (b) the non-magnetic layer 25 is formed also in the region substantially not overlapping with the effective region in a thickness smaller than the thickness in the region substantially overlapping with the effective region, continuous from the region substantially overlapping with the effective region. Therefore, in the fourth embodiment, portions of the free layer 26, upper metal layer 27 and non-magnetic layer 25 having larger thicknesses define the effective region. Such a structure can be created, for example, by setting the stopping positions of the first and second ion milling with respect to the depth direction, described above in the method of manufacturing the magnetic head according to the first embodiment, such that a portion of the non-magnetic layer 25 is removed.

The fourth embodiment can also provide similar advantages to the first embodiment.

Next, a magnetic head according to a fifth embodiment of the present invention will be described with reference to FIG. 12.

Figure 12:
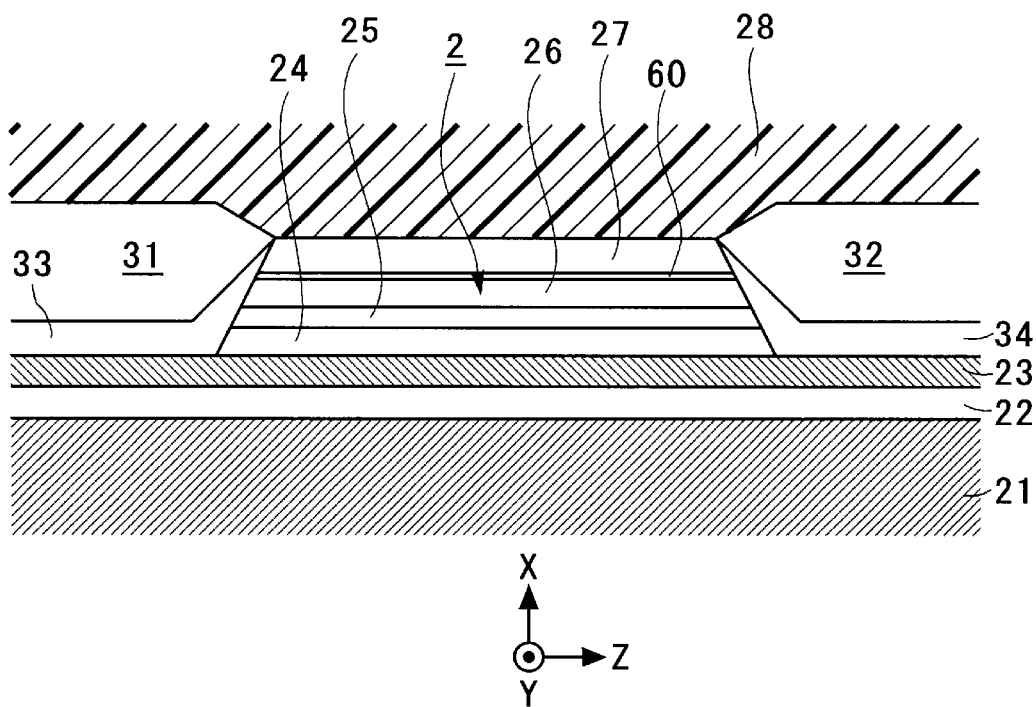
FIG. 12 is a general cross-sectional view schematically illustrating a main portion of a magnetic head according to a fifth embodiment of the present invention.

FIG. 12 is a general cross-sectional view schematically illustrating a main portion of the magnetic head according to the fifth embodiment of the present invention, and corresponds to FIG. 4. In FIG. 12, elements identical or corresponding to those in FIG. 4 are designated by the same reference numerals, and repetitive description thereon is omitted.

As can be seen from a comparison of FIG. 12 with FIG. 4, the fifth embodiment differs from the first embodiment only in that a thin insulating layer 60 is formed between the free layer 26 and upper metal layer 26 only over the region substantially overlapping with the effective region to such an extent that the free layer 26 is not completely electrically insulated from the upper metal layer 27. Though not particularly limited, the thin insulating layer 60 is preferably formed of oxide or nitride. The thin insulating layer 60 may have a thickness in which layers overlying and underlying the insulating layer 60 are not completely insulated, for example, 1 nm or less.

A thin layer such as the thin insulating layer 60 is, so to speak, an incomplete layer, and can be modeled as a layer substantially uniformly formed with pin holes or the like for purposes of description. Thus, the thin insulating layer 60 effectively reduces the area of a path through which a sense current flows between the upper metal layer 27 and free layer 26, thereby producing a similar effect to a reduction in the area of the effective region without actually reducing the area of the effective area. In other words, the thin insulating layer 60 acts to increase the aforementioned $\Delta R$ while maintaining an improved MR ratio. For this reason, according to the fifth embodiment, the magnetic head can produce a high output signal even in a narrow track to increase the recording density, in a manner similar to the first embodiment.

As described above, the fifth embodiment can also provide similar advantages to the first embodiment. However, a reduction in the area of the effective region is limited by reasons of manufacturing. In contrast, according to the fifth embodiment, the aforementioned $\Delta R$ can be increased while maintaining an improved MR ratio without reducing the area of the effective region, so that the aforementioned $\Delta R$ can be increased to a desired degree while maintaining an improved MR ration, irrespective of such limitations due to the manufacturing.

In an alternative, the magnetic head according to the fifth embodiment can be manufactured, for example, by sequentially laminating the respective layers 16, 21–26, 60, 27, instead of sequentially laminating the respective layers 16, 21–27 in the process as illustrated in FIGS. 5A and 5B, and milling the layer 60 together with the layers 24–27 in the first and second milling in the method of manufacturing the magnetic head according to the first embodiment. The layer 60 can be formed, for example, by a sputter method or the like.

In the fifth embodiment, the thin insulating layer 60 is formed between the free layer 26 and upper metal layer 27. However, the present invention is not limited to this formation, but the thin insulating layer 60 may be formed between at least one surface at least one layer intervening between the electrodes 21, 28 and an facing surface of an adjacent layer facing to the at least one surface. For example, the thin insulating layer 60 may be formed one or more locations between the layers 21, 22, between the layers 22, 23, between the layers 23, 24, between the layers 24, 25, between layers 25, 26, between the layers 26, 27, and between the layers 27, 28. Also, when any of the layers 22–27 is, for example, a laminate of a plurality of layers (a plurality of constituent layers), the thin insulating layer 60 may be formed between two layers of the plurality of constituent layers. Nevertheless, the thin insulating layer 60 is preferably formed on an upper surface or a lower surface of any constituent layer of any of the pinned layer 24, non-magnetic layer 25 and free layer 26. This is because when the thin insulating layer 60 is formed at such a position, the thin insulating layer 60 will exerts more the function of adjusting the path of the sense current.

Also, in the fifth embodiment, the thin insulating layer 60 is formed only in the region substantially overlapping with the effective region. In the present invention, however, the thin insulating layer 60 may extend to a region other than the region substantially overlapping with the effective region. For example, when the thin insulating layer 60 is formed between the layers 23, 24 in FIG. 12, the thin insulating layer 60 may extend between the layers 33, 34 and the layer 23.

It should be understood that a thin insulating layer corresponding to the thin insulating layer 60 in FIG. 12 may be provided as well in the aforementioned second to fourth embodiments.

Next, a magnetic head according to a sixth embodiment of the present invention will be described with reference to FIG. 13.

Figure 13:
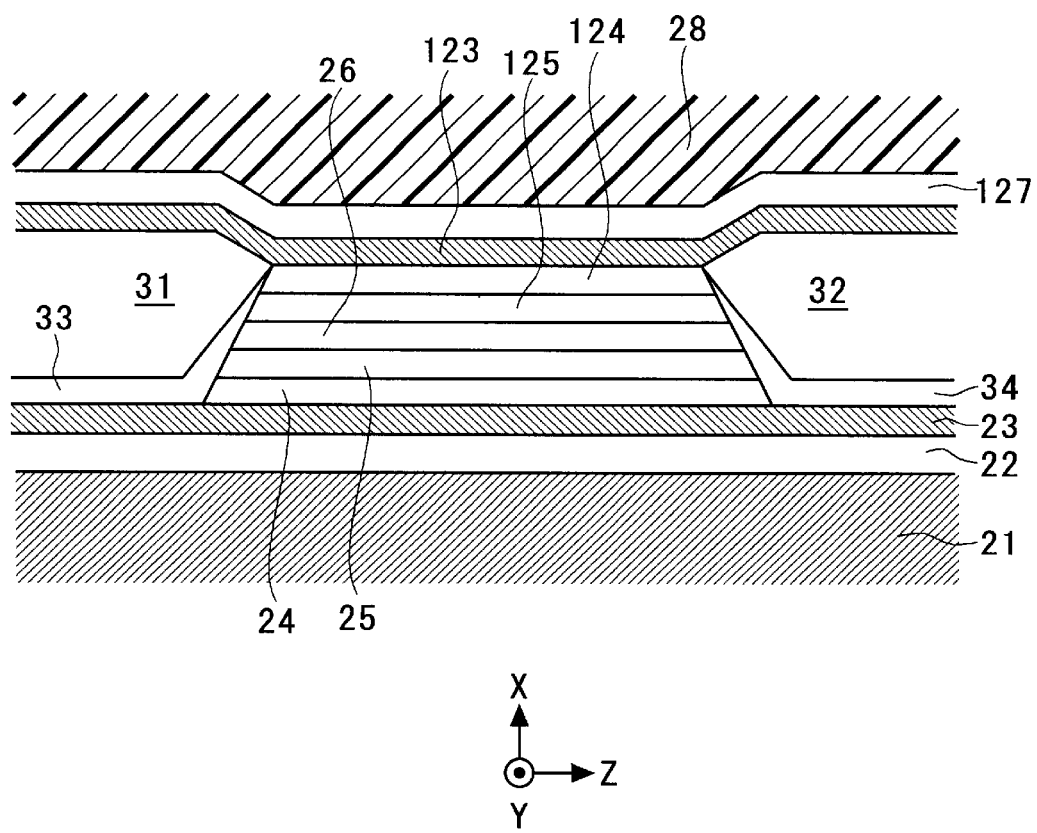
FIG. 13 is a general cross-sectional view schematically illustrating a main portion of a magnetic head according to a sixth embodiment of the present invention.

FIG. 13 is a general cross-sectional view schematically illustrating a main portion of the magnetic head according to the sixth embodiment of the present invention, and corresponds to FIG. 4. In FIG. 13, elements identical or corresponding to those in FIG. 4 are designated by the same reference numerals, and repetitive description thereon is omitted.

The sixth embodiment principally differs from the first embodiment only in aspects described below. Specifically, in the sixth embodiment, the upper metal layer 27 in FIG. 4 is removed, and instead, a non-magnetic layer 125, a pinned layer 124, a pin layer 123, and an upper metal layer 127 are formed in this order from the free layer 26 between the free layer 26 and upper electrode 28. The non-magnetic layer 125 and pinned layer 124 are formed only in the region substantially overlapping with the effective region, in a manner similar to the pinned layer 24, non-magnetic layer 25 and free layer 26. On the other hand, the pin layer 123 and upper metal layer 127 are formed in the region substantially overlapping with the effective region in a predetermined thickness, and also formed in the region substantially not overlapping with the effective region substantially in the same thickness as the predetermined thickness (the thickness may be smaller than the predetermined thickness), continuous from the region substantially overlapping with the effective region, in a manner similar to the pin layer 23 and lower metal layer 22. The pin layer 123 has an upper surface entirely in electrical contact with the lower surface of the electrode 28 through the upper metal layer 127. It should be understood that the layers 123–125 can be formed of the same materials as the layers 23–25, respectively. Also, the upper metal layer 127 can be formed, for example, of the same material as the upper metal layer 27 in FIG. 4.

While the layers 23–26, 123–125 constitute a dual type spin valve film in the sixth embodiment, the spreading pin layers 23, 123 reduce the resistance values of the pin layers 23, 123 for a sense current, in a manner similar to the first embodiment, to increase the actual MR ratio provided by the entire device between the electrodes 21, 28. Alternatively, in the present invention, one of the pin layers 23, 123 may be formed only in the region substantially overlapping with the non-magnetic layer 25.

In the present invention, the sixth embodiment may be modified in a similar manner to the modifications of the first embodiment to provide the second to fifth embodiments.

Next, a magnetic head according to a seventh embodiment of the present invention will be described with reference to FIG. 14.

Figure 14:
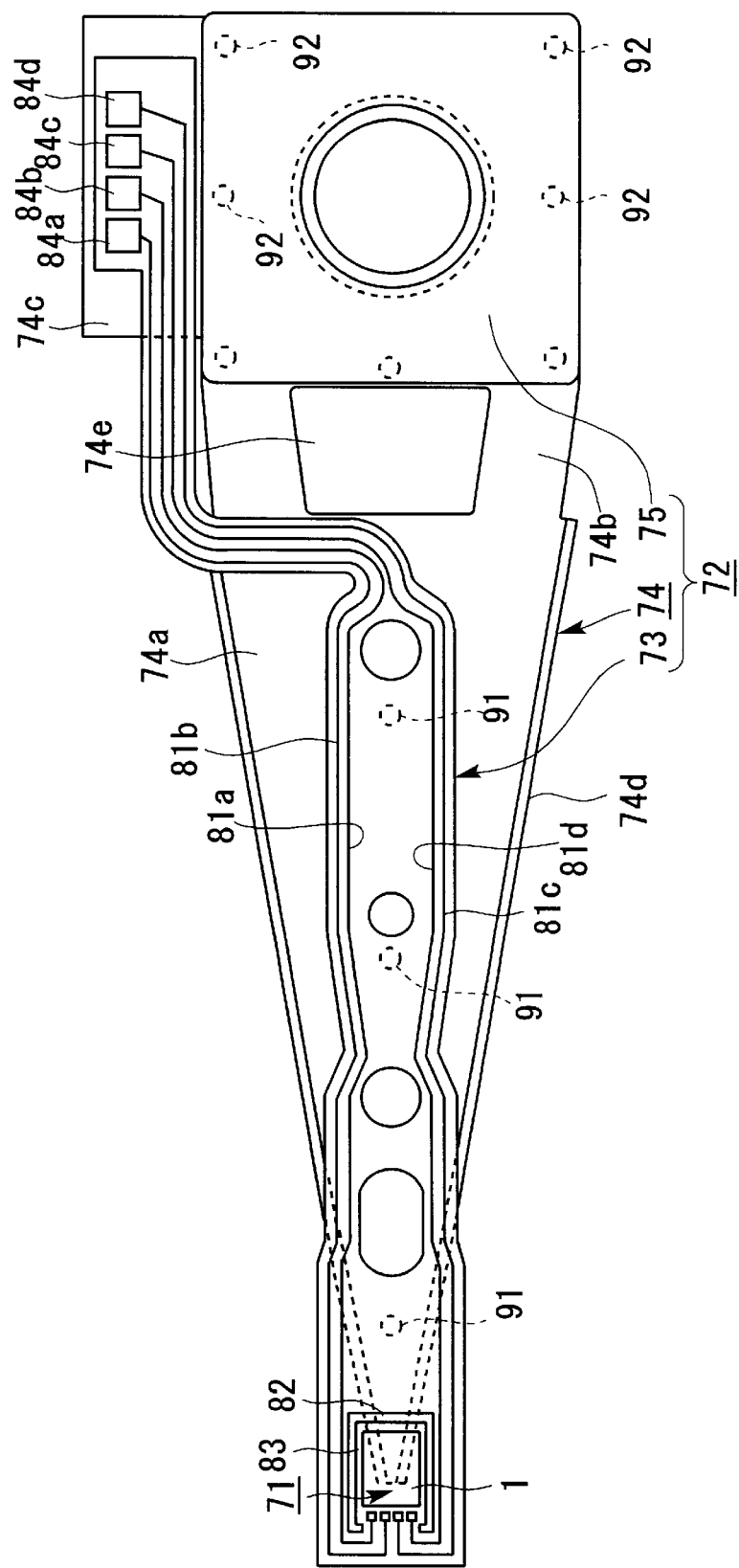
FIG. 14 is a general plan view illustrating a head suspension assembly according to a seventh embodiment of the present invention.

FIG. 14 is a general plan view illustrating a head suspension assembly according to the seventh embodiment, when seen from a plane opposite to a magnetic recording medium.

The head suspension assembly according to the seventh embodiment comprises a magnetic head 71; and a suspension 72 for supporting the magnetic head 71 which is mounted near a leading end thereof. Any of the magnetic heads according to the aforementioned first to sixth embodiments and the exemplary modification is used as the magnetic head 71. FIG. 14 only illustrates a slider 1 (see also FIG. 1) as a component of the magnetic head 71.

The suspension 72 comprises a flexure 73 on which the slider 1 of the magnetic head 71 is mounted; a load beam 74 for supporting the flexure 73 and applying a pressing force (load) to the slider 1 of the magnetic head 71; and a base plate 75.

Though not shown, the flexure 73 is comprised of a substrate extending in a strip shape from a leading end to a proximal end thereof and made of a thin stainless steel plate or the like; an insulating layer formed on the substrate and made of a polyimide layer or the like; four conductor patterns 81a–81d formed on the insulating layer for inputting and outputting signals; and a protection layer formed on these elements and made of a polyimide layer or the like. The conductor patterns 81a–81d extend substantially over the entire length of the flexure 73 along a lengthwise direction thereof.

The flexure 73 is formed at a leading end with a groove 82 substantially in an inverted C-shape, in a plan view, to provide a gimbal 83 to which the slider 1 of the magnetic head 71 is bonded with a bonding agent or the like. The flexure 73 is formed with four bonding pads each electrically connected to one end of a conductor pattern 81a–81d at a location close to a bonding pad 5a–5d (see FIG. 1) formed on the slider 1. These bonding pads are electrically connected to the bonding pads 5a–5d of the slider 1, respectively, with gold balls or the like. The flexure 73 is also formed near a proximal end with bonding pads 84a–84d electrically connected to the other ends of the conductor patterns 81a–81d, respectively, for connection to an external circuit.

The load beam 74 is formed of a relatively thick stainless steel plate or the like. The load beam 74 comprises a rigid portion 74a at a leading end substantially in a triangular shape in a plan view; a base plate joint near the proximal end; a resilient portion 74b positioned between the rigid portion 74a and the joint for generating a pressing force which is applied to the slider 1 of the magnetic head 71; and a supporting portion 74c extending from the joint to one side for supporting the proximal end of the flexure 73. In FIG. 14, a bent-up portion 74d is formed for increasing the rigidity of the rigid portion 74a, and a hole 74e is formed for adjusting the pressing force generated by the resilient portion 74b. The flexure 73 is secured to the rigid portion 74a of the load beam 74 at a plurality of spot welding points 91 by laser welding or the like. Also, a base plate 75 is secured to the joint of the load beam 74 at a plurality of spot welding points 92. A portion of the flexure 73 near the proximal end is supported by a support 74c of the load beam 74 which protrudes from the base plate 75 to one side.

In the seventh embodiment, the head suspension assembly is mounted with any of the magnetic heads according to the aforementioned first to sixth embodiments and exemplary modifications thereof as the magnetic head 71, so that when the head suspension assembly according to the seventh embodiment is used in a magnetic disk drive or the like, the resulting magnetic disk drive can provide a higher recording density.

Next, description will be made on samples fabricated in accordance with Examples 1–3.

A GMR device having a configuration similar to the GMR device 2 employed in the magnetic head according to the first embodiment was fabricated as a sample of Example 1.

Figure 15A:
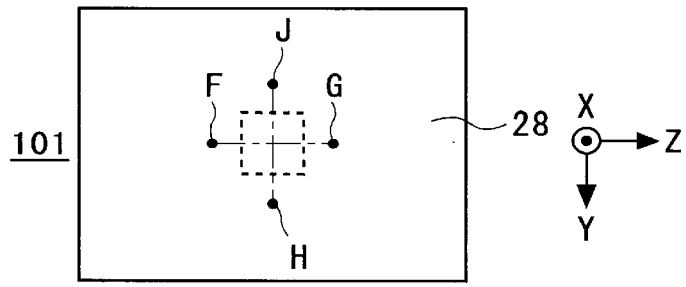
FIG. 15A is a general plan view schematically illustrating a sample in Example 1.
Figure 15B:
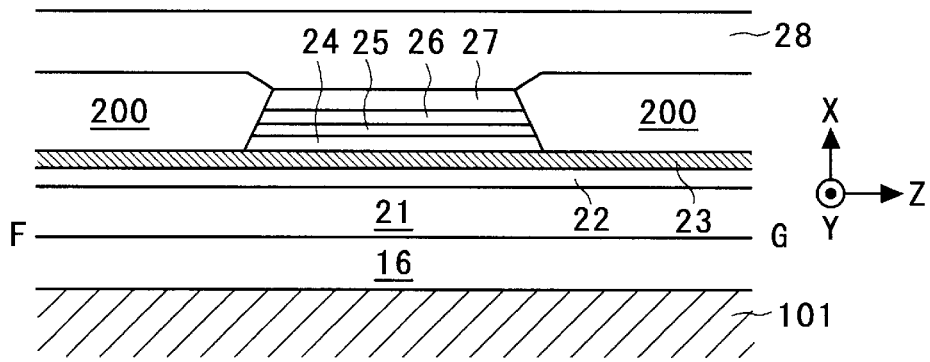
FIG. 15B is a general cross-sectional view along a line F-G in FIG. 15A.

The structure of the sample of Example 1 is as illustrated in FIGS. 15A and 15B. Main layers constituting the sample are made by materials in composition and thickness as shown in Table 1 below. AlTic was used for the wafer 101, while an $Al_2O_3$ layer was used for the underlying layer. FIGS. 15A and 15B are diagrams schematically illustrating the sample of Example 1, where FIG. 15A is a general plan view; and FIG. 15B a general cross-sectional view along a line F-G in FIG. 15A. A cross section along a line H-J in FIG. 15A is identical to that shown in FIG. 15B. In FIGS. 15A and 15B, elements identical or corresponding to those in FIGS. 1 to 8B are designated by the same reference numerals, and repetitive description thereon is omitted.

TABLE 1

| Name of Layer and Reference Numeral in Drawings | Composition and Thickness of Layer (When composed of two layers or more, a layer more to the left is positioned lower (near the substrate)) |
|---|---|
| Upper Electrode 28 (serving also as Upper Magnetic Shield) | NiFe (2 μm) |
| Insulating Layer 200 | $Al_2O_3$ (50 nm) |
| Upper Metal Layer 27 | Rh (5 nm) |
| Free Layer 26 | CoFe (1 nm)/NiFe (3 nm) |
| Non-Magnetic Layer 25 | Cu (3 nm) |
| Pinned Layer 24 | CoFe (2 nm)/Ru (0.8 nm)/CoFe (3 nm) |
| Pin layer 23 | PtMn (15 nm) |
| Lower Metal Layer 22 | Ta (5 nm)/NiFe (2 nm) |

TABLE 1-continued

| Name of Layer and Reference Numeral in Drawings | Composition and Thickness of Layer (When composed of two layers or more, a layer more to the left is positioned lower (near the substrate)) |
|---|---|
| Lower Electrode 21 (serving also as Lower Magnetic Shield) | NiFe (2 μm) |

The sample of Example 1 principally differs in structure from the GRM device illustrated in FIGS. 1 to 8B in that an insulating layer 200 is formed to surround the layers 24–27 instead of the layers 31, 32 including the hard magnetic layers, and the insulating layers 33–35.

Figure 18A:
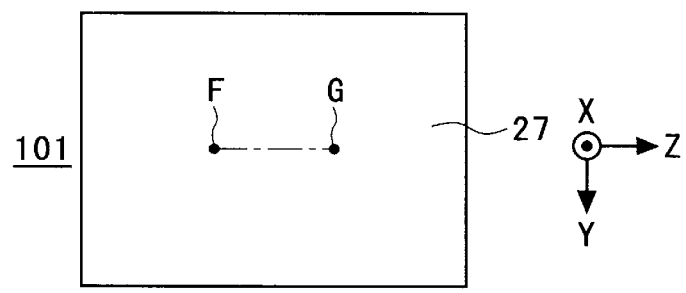
FIG. 18A is a general plan view schematically illustrating a step in a method of manufacturing the sample in Example 1.
Figure 18B:
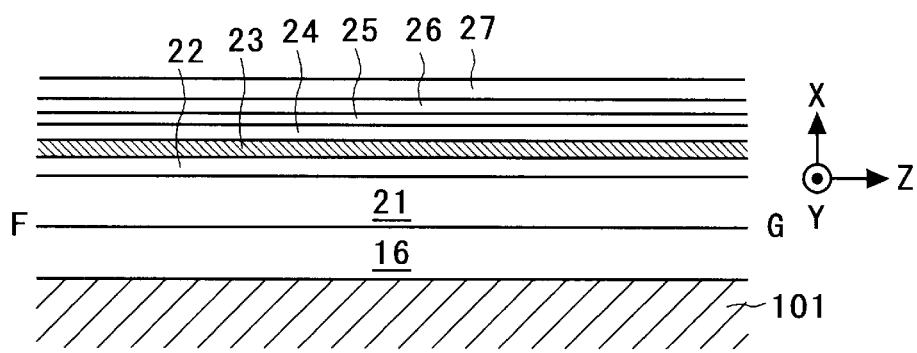
FIG. 18B is a general cross-sectional view taken along a line F-G in FIG. 18A.
Figure 19A:
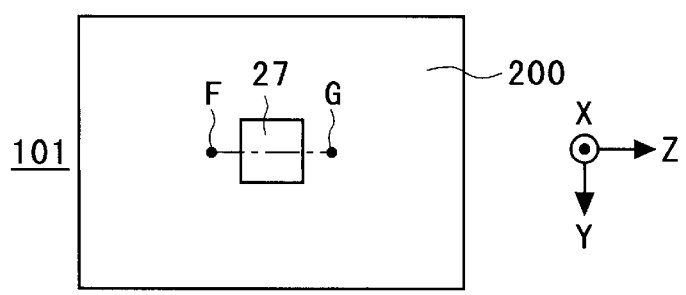
FIG. 19A is a general plan view schematically illustrating another step in the method of manufacturing the sample in Example 1.

The sample of Example 1 was fabricated in a method described below. This fabricating method is described with reference to FIGS. 18A, 18B, 19A and 19B. FIGS. 18A, 19A are general plan views, respectively. FIG. 18B is a general cross-sectional view taken along a line F-G in FIG. 18A, and FIG. 19B is a general cross-sectional view taken along a line F-G in FIG. 19A.

First, the underlying layer 16, lower electrode 21, lower metal layer 22, pin layer 23, pinned layer 24, non-magnetic layer 25, free layer 26, and upper metal layer 27 were sequentially laminated on the wafer 101 (FIGS. 18A and 18B). In this event, the lower electrode 21 was formed by a plating method, while other layers were formed by a sputter method.

Next, the pinned layer 24, non-magnetic layer 25, free layer 26 and upper metal layer 27 were removed from a region other than a region of 100 nm×100 nm in a plan view by ion milling. This ion milling was stopped, while monitoring with SIMS, at a depth coincident with the boundary between the pinned layer 24 and pin layer 23 to completely remove up to the pinned layer 24 with respect to the depth direction but substantially never to remove the pin layer 23. In other wards, the thickness of the pin layer 23 in a region which did not substantially overlap with the layers 24–27 (hereinafter called the "spreading region") was chosen to be 15 nm, identical to the thickness in a region which substantially overlaps with the layers 24–27 (hereinafter called the "overlapping region") (see Table 2, later described).

Figure 19B:
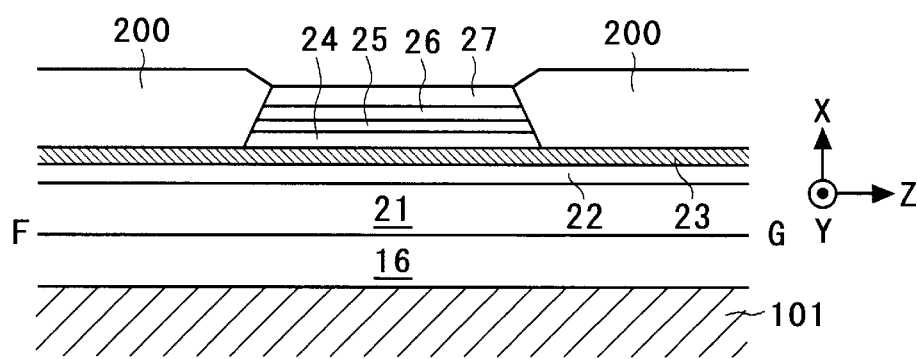
FIG. 19B is a general cross-sectional view taken along a line F-G in FIG. 19A.

Next, the insulating layer 200 was deposited, and a portion of the insulating layer 200 on the upper metal layer 27 was removed by a lift-off method (FIGS. 19A and 19B). Finally, the upper electrode 28 was formed by a plating method to complete the sample of Example 1 illustrated in FIGS. 15A and 15B.

Figure 16:
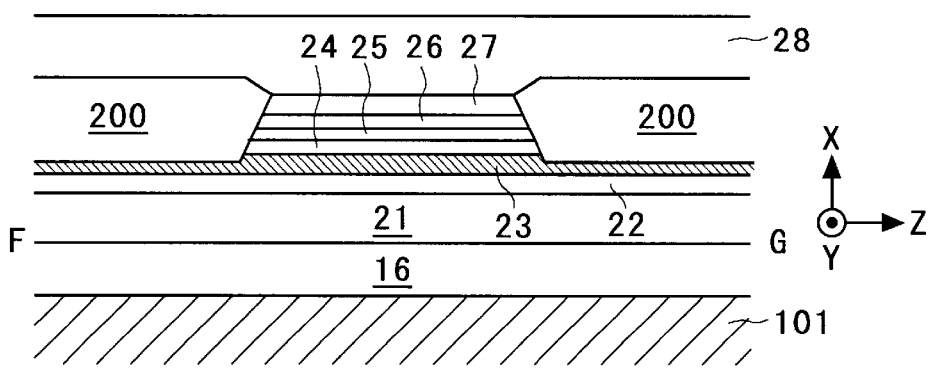
FIG. 16 is a general cross-sectional view schematically illustrating a sample in Example 2.
Figure 17:
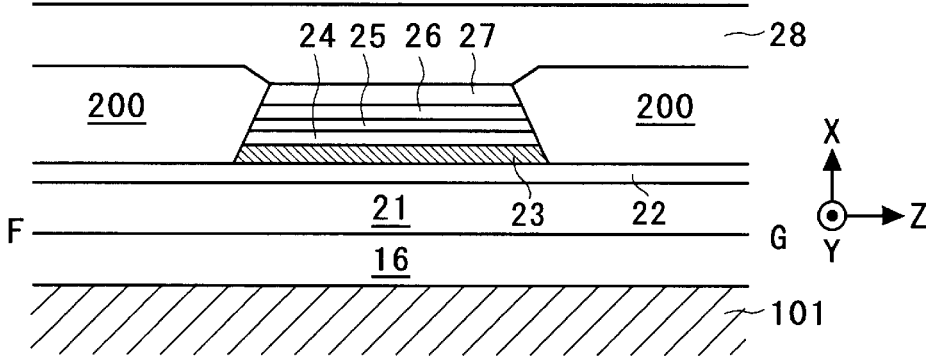
FIG. 17 is a general cross-sectional view schematically illustrating a sample in a comparative example.

A sample of Example 2 and a sample of a comparative example, which were identical to the sample of Example 1 except for aspects described below, were fabricated by a fabricating method which was different from the method of fabricating Example 1 only in aspects described below. FIG. 16 is a general cross-sectional view schematically illustrating the sample of Example 2. FIG. 17 is a general cross-sectional view schematically illustrating the sample of the comparative example. FIGS. 16 and 17 correspond to FIG. 15B.

In the sample of Example 1, the thickness of the spreading region of the pin layer 23 was chosen to be 15 nm which was identical to the thickness of the overlapping region, as described above, as shown in Table 2 below. On the other hand, in the sample of Example 2, the milling was performed to remove the pin layer 23 up to 3 nm from the upper surface thereof to set the thickness of the pin layer 23 in the spreading region to 12 nm. In the sample of the comparative example, the milling was performed to the boundary between the pin layer 23 and lower metal layer 22, such that the pin region 23 was left only in the overlapping region and was removed in the spreading region, in a manner similar to the prior art. The thickness of the pin layer 23 in Table 1 indicates the thickness in the overlapping region.

TABLE 2

| Sample | Thickness of Spreading Region of Pin Layer | MR Ratio |
|---|---|---|
| Example 1 | 15 nm | 7.52% |
| Example 2 | 12 nm | 5.01% |
| Comparative Example | non | 1.45% |

Each of these samples was applied with a magnetic field of ±2 kOe, and a predetermined current was supplied between the electrodes 21, 28 to measure the resistance value between the electrodes 21, 28, and an actual MR ratio provided by the entire device was calculated from the result of measurements. Table 2 shows the MR ratio calculated for the respective samples. It can be seen that the actual MR ratio is higher when the pin region 23 is left in the spreading region than when the pin region 23 is removed in the spreading region, and that the MR ratio is further increased when the thickness of the pin layer 23 in the spreading region is identical to the thickness in the overlapping region than when the thickness of the pin layer 23 in the spreading region is smaller than the thickness of the overlapping region.

Also, a magnetic head having a configuration similar to that of the magnetic head according to the fifth embodiment was fabricated as a sample of Example 3 by a manufacturing method similar to the aforementioned method of manufacturing the magnetic head according to the fifth embodiment (in which a modification related to the thin insulating layer 60 was added to the method of manufacturing the magnetic head according to the first embodiment). Compositions of main layers which make up the sample were chosen as shown in Table 3 below. Also, in this sample, the GMR device 2 had the track width TW chosen to be 130 nm. when a head output of the sample of the Example 3 was measured, a value as high as 2.3 mV was observed.

TABLE 3

| Name of Layer and Reference Numeral in Drawings | Composition and Thickness of Layer (When composed of two layers or more, a layer more to the left is positioned lower (near the substrate)) |
|---|---|
| Upper Electrode 28 (serving also as Upper Magnetic Shield) | NiFe (2 μm) |
| Insulating Layer 35 | Al$_2$O$_3$ (60 nm) |
| Layers 31, 32 including Hard Magnetic Layer | TiW (10 nm)/CoPt (20 nm)/Ta (3 nm)/Al$_2$O$_3$ (10 nm) |
| Insulating Layer 33 | Al$_2$O$_3$ (5 nm) |
| Upper Metal Layer 27 | Rh (5 nm) |
| Thin Insulating Layer 60 | Ta$_2$O$_5$ (0.5 nm) |
| Free Layer 26 | CoFe (1 nm)/NiFe (3 nm) |
| Non-Magnetic Layer 25 | Cu (3 nm) |
| Pinned Layer 24 | CoFe (2 nm)/Ru (0.8 nm)/CoFe (3 nm) |
| Pin layer 23 | PtMn (15 nm) |
| Lower Metal Layer 22 | Ta (5 nm)/NiFe (2 nm) |

TABLE 3-continued

| Name of Layer and Reference Numeral in Drawings | Composition and Thickness of Layer (When composed of two layers or more, a layer more to the left is positioned lower (near the substrate)) |
|---|---|
| Lower Electrode 21 (serving also as Lower Magnetic Shield) | NiFe (2 μm) |

While the present invention has been described in connection with several embodiments, modifications thereof, and examples, the present invention is not limited to them.

For example, GMR film structures may have a pin layer (antiferromagnetic layer) in a lower portion (near a substrate) or in an upper portion (opposite to the substrate) depending on a non-magnetic layer. The present invention can be applied to either case.

While the foregoing embodiments and the like have shown examples in which the magneto-resistive device (GMR device) according to the present invention is used in a magnetic head, the magneto-resistive device according to the present invention can be applied as well to a variety of other applications.

As described above, the present invention can provide a magneto-resistive element which can increase the actual MR ratio, as compared with the prior art, though it has a CPP structure using a spin valve film.

Also, the present invention can provide a magnetic head which can provide a high output signal even in a narrow track to increase the recording density by using the magneto-resistive device as described above.

Further, the present invention can provide a head suspension assembly which can increase the recording density of a magnetic disk drive and the like.

What is claimed is:

1. A magneto-resistive device comprising:
a first electrode formed on one surface side of a base;
a magneto-resistive layer formed on one surface side of said first electrode, the one surface side of said first electrode being opposite to other surface side of said first electrode facing to said base; and
a second electrode formed on one surface side of said magneto-resistive layer, the one surface side of said magneto-resistive layer being opposite to other surface of said magneto-resistive layer facing to said first electrode;
wherein said magneto-resistive layer includes a non-magnetic layer; a free layer formed on one surface side of said non-magnetic layer; a pinned layer formed on other surface side of said non-magnetic layer; and a pinning layer formed on one surface side of said pinned layer, the one surface side of said pinned layer being opposite to other surface of said pinned layer facing to said non-magnetic layer; and
said pinning layer is formed in a region which substantially overlaps with an effective region in a film plane direction in which a current flows in a direction substantially perpendicular to the film plane direction between said first electrode and said second electrode in a predetermined thickness, and is formed in a region which does not substantially overlap with said effective region substantially in the same thickness as said predetermined thickness or in a thickness smaller than said predetermined thickness, continuous from said region which substantially overlaps with said effective region.

2. A magneto-resistive device according to claim 1, wherein said pinning layer has one surface substantially entirely placed in electrical contact with one surface of said first electrode or said second electrode.

3. A magneto-resistive device according to claim 1, further comprising a thin insulating layer formed between at least one surface of at least one layer intervening between said first electrode and said second electrode and an facing surface of an adjacent layer facing to the at least one surface over at least a region which substantially overlaps with at least said effective region to such an extent that said one layer is not completely electrically insulated from said adjacent layer.

4. A magneto-resistive device according to claim 3, wherein said at least one layer includes any constituent layer of one of said non-magnetic layer, said free layer, and said pinned layer.

5. A magneto-resistive device according to claim 3, wherein said thin insulating layer includes an oxide or a nitride.

6. A magneto-resistive device according to claim 1, wherein said non-magnetic layer is formed only in the region which substantially overlaps with said effective region.

7. A magneto-resistive device according to claim 1, wherein said free layer is formed only in the region which substantially overlaps with said effective region.

8. A magneto-resistive device according to claim 1, wherein said pinned layer is formed only in the region which substantially overlaps with said effective region.

9. A magneto-resistive device according to claim 1, wherein said pinning layer includes one or more of materials selected from a group consisting of PtMn, IrMn, RuRhMn, FeMn, NiMn, PdPtMn, RhMn, CrMnPt, and other Mn-based alloys.

10. A magneto-resistive device comprising:
a first electrode formed on one surface side of a base;
a magneto-resistive layer formed on one surface side of said first electrode, the one surface side of said first electrode being opposite to other surface side of said first electrode facing to said base; and
a second electrode formed on one surface side of said magneto-resistive layer, the one surface side of said magneto-resistive layer being opposite to other surface of said magneto-resistive layer facing to said first electrode;
wherein said magneto-resistive layer includes a free layer; a first non-magnetic layer formed on one surface side of said free layer, the one surface side of said free layer being closer to said first electrode than other surface side of said free layer opposite to the one surface side of said free layer; a first pinned layer formed on one surface side of said first non-magnetic layer, the one surface side of said first non-magnetic layer being closer to said first electrode than other surface side of said first non-magnetic layer opposite to the one surface of said first non-magnetic layer; a first pinning layer formed on one surface side of said first pinned layer, the one surface being closer to said first electrode than other surface side of said first pinned layer opposite to the one surface side of said first pinned layer; a second non-magnetic layer formed on one surface side of said free layer, the one surface side of said free layer being closer to said second electrode than other surface side of said free layer opposite to the one surface side of said free layer; a second pinned layer formed on one surface side of said second non-magnetic layer, the one surface side of said second non-magnetic layer being closer to said second electrode than other surface side of said second non-magnetic layer opposite to the one surface side of said second non-magnetic layer; and a second pinning layer formed on one surface side of said second pinned layer, the one surface side of said second pinned layer being closer to said second electrode than other surface side of said second pinned layer opposite to the one surface side of said second pinned layer; and at least one of said first pinning layer and said second pinning layer is formed in a region which substantially overlaps with an effective region in a film plane direction in which a current flows in a direction substantially perpendicular to the film plane direction between said first electrode and said second electrode in a predetermined thickness, and is formed in a region which does not substantially overlap with said effective region substantially in the same thickness as said predetermined thickness or in a thickness smaller than said predetermined thickness, continuous from said region which substantially overlaps with said effective region.

11. A magneto-resistive device according to claim 10, wherein said at least one pinning layer has one surface substantially entirely placed in electrical contact with one surface of said first electrode or said second electrode.

12. A magneto-resistive device according to claim 10, further comprising a thin insulating layer formed between at least one surface of at least one layer intervening between said first electrode and said second electrode and an facing surface of an adjacent layer facing to the at least one surface over at least the region which substantially overlaps with said effective region to such an extent that said at least one layer is not completely electrically insulated from said adjacent layer.

13. A magneto-resistive device according to claim 12, wherein said at least one layer includes any constituent layer of one of said first and second non-magnetic layers, said free layer, and said first and second pinned layers.

14. A magneto-resistive device according to claim 12, wherein said thin insulating layer includes an oxide or a nitride.

15. A magneto-resistive device according to claim 10, wherein at least one of said first and second non-magnetic layers is formed only in the region which substantially overlaps with said effective region.

16. A magneto-resistive device according to claim 10, wherein said free layer is formed only in the region which substantially overlaps with said effective region.

17. A magneto-resistive device according to claim 10, wherein at least one of said first and second pinned layers is formed only in the region which substantially overlaps with said effective region.

18. A magneto-resistive device according to claim 10, wherein each of said first and second pinning layers includes one or more of materials selected from a group consisting of PtMn, IrMn, RuRhMn, FeMn, NiMn, PdPtMn, RhMn, CrMnPt, and other Mn-based alloys.

19. A magnetic head having a base, and a magneto-resistive device supported by said base, said magneto-resistive device comprising:

a first electrode formed on one surface side of said base;

a magneto-resistive layer formed on one surface side of said first electrode, the one surface side of said first electrode being opposite to other surface side of said first electrode facing to said base; and a second electrode formed on one surface side of said magneto-resistive layer, the one surface side of said magneto-resistive layer being opposite to other surface side of said magneto-resistive layer facing to said first electrode;

wherein said magneto-resistive layer includes a non-magnetic layer; a free layer formed on one surface side of said non-magnetic layer; a pinned layer formed on other surface side of said non-magnetic layer; and a pinning layer formed on one surface side of said pinned layer, the one surface side of said pinned layer being opposite to other surface side of said pinned layer facing to said non-magnetic layer; and said pinning layer is formed in a region which substantially overlaps with an effective region in a film plane direction in which a current flows in a direction substantially perpendicular to the film plane direction between said first electrode and said second electrode in a predetermined thickness, and is formed in a region which does not substantially overlap with said effective region substantially in the same thickness as said predetermined thickness or in a thickness smaller than said predetermined thickness, continuous from said region which substantially overlaps with said effective region.

20. A head suspension assembly having a magnetic head, and a suspension for supporting said magnetic head mounted near a leading end thereof, said magnetic head including a base, and a magneto-resistive device supported by said base, said magneto-resistive device comprising:

a first electrode formed on one surface side of said base;

a magneto-resistive layer formed on one surface side of said first electrode, the one surface side of said first electrode being opposite to other surface side of said first electrode facing to said base; and a second electrode formed on one surface side of said magneto-resistive layer, the one surface side of said magneto-resistive layer being opposite to other surface side of said magneto-resistive layer facing to said first electrode;

wherein said magneto-resistive layer includes a non-magnetic layer; a free layer formed on one surface side of said non-magnetic layer; a pinned layer formed on other surface side of said non-magnetic layer; and a pinning layer formed on one surface side of said pinned layer, the one surface side of said pinned layer being opposite to other surface side of said pinned layer facing to said non-magnetic layer; and said pinning layer is formed in a region which substantially overlaps with an effective region in a film plane direction in which a current flows in a direction substantially perpendicular to the film plane direction between said first electrode and said second electrode in a predetermined thickness, and is formed in a region which does not substantially overlap with said effective region substantially in the same thickness as said predetermined thickness or in a thickness smaller than said predetermined thickness, continuous from said region which substantially overlaps with said effective region.

* * * * *